United States Patent
Tadokoro et al.

(10) Patent No.: US 12,228,390 B2
(45) Date of Patent: Feb. 18, 2025

(54) INFORMATION PROCESSING APPARATUS, INFORMATION PROCESSING METHOD AND COMPUTER-READABLE RECORDING MEDIUM

(71) Applicant: Tokyo Electron Limited, Tokyo (JP)

(72) Inventors: Masahide Tadokoro, Kumamoto (JP); Masashi Enomoto, Kumamoto (JP); Toyohisa Tsuruda, Kumamoto (JP); Hiroshi Nakamura, Kumamoto (JP); Kazuhiro Shiba, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 827 days.

(21) Appl. No.: 17/177,289

(22) Filed: Feb. 17, 2021

(65) Prior Publication Data

US 2021/0262781 A1 Aug. 26, 2021

(30) Foreign Application Priority Data

Feb. 21, 2020 (JP) ................................ 2020-028156

(51) Int. Cl.
  *G01B 11/06* (2006.01)
  *H01L 21/67* (2006.01)
(52) U.S. Cl.
  CPC ...... *G01B 11/0616* (2013.01); *H01L 21/6715* (2013.01); *H01L 21/67253* (2013.01)
(58) Field of Classification Search
  None
  See application file for complete search history.

(56) References Cited

U.S. PATENT DOCUMENTS

| 2001/0022897 | A1* | 9/2001 | Ogata | ..................... G03F 7/168 |
| | | | | 396/564 |
| 2005/0087298 | A1* | 4/2005 | Tanaka | ................. G05B 13/048 |
| | | | | 156/345.24 |
| 2009/0292491 | A1* | 11/2009 | Fukuoka | ........... H01L 21/67253 |
| | | | | 118/712 |
| 2015/0324970 | A1* | 11/2015 | Iwanaga | ................... G06T 7/60 |
| | | | | 382/145 |

FOREIGN PATENT DOCUMENTS

| CN | 110598255 A | * 12/2019 | ............. G16C 20/30 |
| JP | H08-321449 A | 12/1996 | |

(Continued)

*Primary Examiner* — David Earl Ogg
(74) *Attorney, Agent, or Firm* — Chrisman Gallo Tochtrop LLC

(57) ABSTRACT

An information processing apparatus includes a prediction unit configured to calculate, based on a film thickness model representing a relationship between a state of a substrate processing apparatus and a film thickness of a coating film formed on a front surface of a substrate by the substrate processing apparatus and pre-data representing the state of the substrate processing apparatus before the substrate is processed by the substrate processing apparatus, a predicted film thickness when the substrate is processed by the substrate processing apparatus; and an output unit configured to output, based on the predicted film thickness, instruction information on a processing of the substrate before the substrate is processed by the substrate processing apparatus.

17 Claims, 15 Drawing Sheets

(56) References Cited

FOREIGN PATENT DOCUMENTS

| | | | |
|---|---|---|---|
| JP | 2003-257850 A | | 9/2003 |
| JP | 2004214385 A | * | 7/2004 |
| JP | 2007-317705 A | | 12/2007 |
| JP | 2010087135 A | * | 4/2010 |
| JP | 2012227282 A | * | 11/2012 |
| JP | 2012-253156 A | | 12/2012 |
| JP | 2015-215193 A | | 12/2015 |
| WO | WO2003056610 A1 | * | 7/2003 |

* cited by examiner

INFORMATION PROCESSING APPARATUS, INFORMATION PROCESSING METHOD AND COMPUTER-READABLE RECORDING MEDIUM

CROSS-REFERENCE TO RELATED APPLICATION

This application claims the benefit of Japanese Patent Application No. 2020-028156 filed on Feb. 21, 2020, the entire disclosure of which is incorporated herein by reference.

TECHNICAL FIELD

The exemplary embodiments described herein pertain generally to an information processing apparatus, an information processing method and a computer-readable recording medium.

BACKGROUND

Patent Document 1 discloses an apparatus configured to measure a film thickness of a film formed on a substrate based on an image of a surface of the substrate.

Patent Document 1: Japanese Patent Laid-open Publication No. 2015-215193

SUMMARY

An information processing apparatus includes a prediction unit configured to calculate, based on a film thickness model representing a relationship between a state of a substrate processing apparatus and a film thickness of a coating film formed on a front surface of a substrate by the substrate processing apparatus and pre-data representing the state of the substrate processing apparatus before the substrate is processed by the substrate processing apparatus, a predicted film thickness when the substrate is processed by the substrate processing apparatus; and an output unit configured to output, based on the predicted film thickness, instruction information on a processing of the substrate before the substrate is processed by the substrate processing apparatus.

The foregoing summary is illustrative only and is not intended to be in any way limiting. In addition to the illustrative aspects, exemplary embodiments, and features described above, further aspects, exemplary embodiments, and features will become apparent by reference to the drawings and the following detailed description.

BRIEF DESCRIPTION OF THE DRAWINGS

In the detailed description that follows, exemplary embodiments are described as illustrations only since various changes and modifications will become apparent to those skilled in the art from the following detailed description. The use of the same reference numbers in different figures indicates similar or identical items.

DETAILED DESCRIPTION

Figure 1:
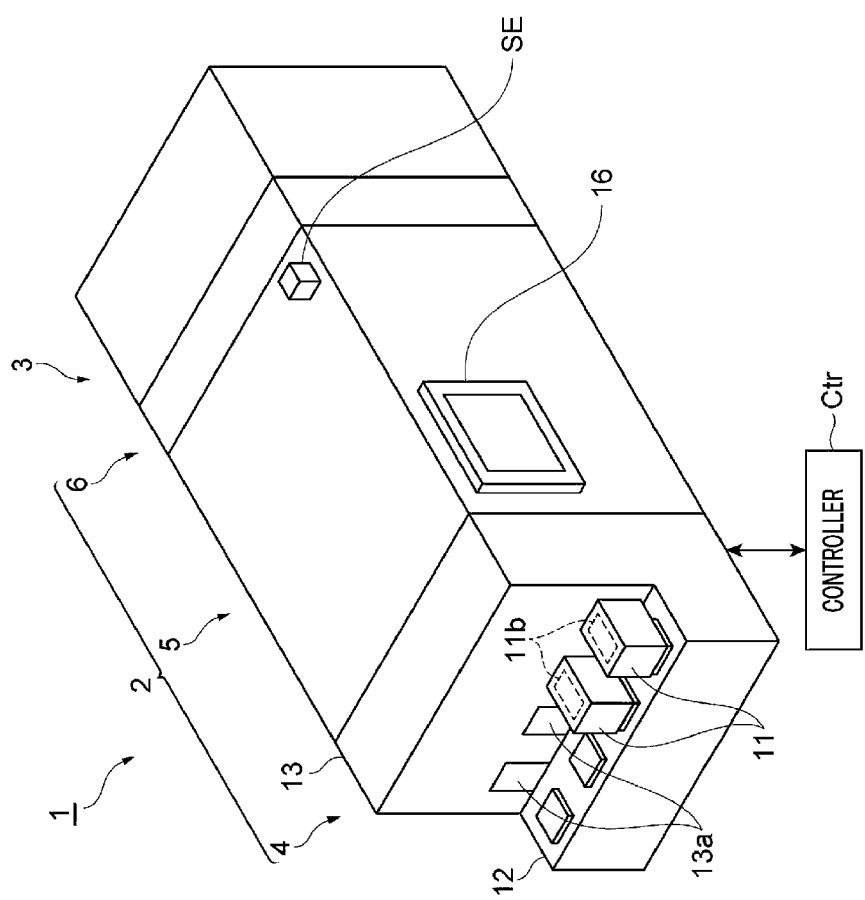
FIG. 1 is a perspective view illustrating an example of a substrate processing system.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other exemplary embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

In the following description, same parts or parts having same function will be assigned same reference numerals, and redundant description will be omitted.

[Substrate Processing System]

First, referring to FIG. 1 to FIG. 3, a configuration of a substrate processing system 1 will be described. The substrate processing system 1 is equipped with a coating and developing apparatus 2 (substrate processing apparatus), an exposure apparatus 3 and a controller Ctr (information processing apparatus).

The exposure apparatus 3 is configured to send and receive a substrate W to and from the coating and developing apparatus 2 and perform an exposure processing (pattern exposure) of a resist film R (coating film) formed on a front surface Wa of the substrate W. The exposure apparatus 3 may selectively radiate an energy ray to an exposure target portion of the resist film R using a suitable method such as immersion lithography.

The energy ray may be, for example, ionizing radiation, non-ionizing radiation or the like. The ionizing radiation is radiation with sufficient energy to ionize atoms or molecules. The ionizing radiation may include, for example, extreme ultraviolet rays (EUV), electron beam, ion beam, X-ray, α-ray, β-ray, γ-ray, heavy particle ray, proton beam and the like. The non-ionizing radiation is radiation with insufficient energy to ionize atoms or molecules. The non-ionizing radiation may include, for example, g-ray, i-ray, KrF excimer laser, ArF excimer laser, $F_2$ excimer laser and the like.

The coating and developing apparatus 2 is configured to form the resist film R on the front surface Wa of the substrate W before the exposure processing by the exposure apparatus 3. The coating and developing apparatus 2 is configured to develop the resist film R after the exposure processing.

The substrate W may have a circular plate shape or may have a plate shape other than the circular shape such as a polygonal shape. The substrate W may have a notch portion formed by partially cutting out the substrate W. The notch portion may be, for example, a notch (U-shaped or V-shaped groove) or a linearly extending portion (so-called orientation flat). The substrate W may be, for example, a semiconductor substrate (silicon wafer), a glass substrate, a mask substrate, an FPD (Flat Panel Display) substrate or other various substrates. The substrate W may have a diameter of, for example, about 200 mm to 450 mm.

Figure 2:
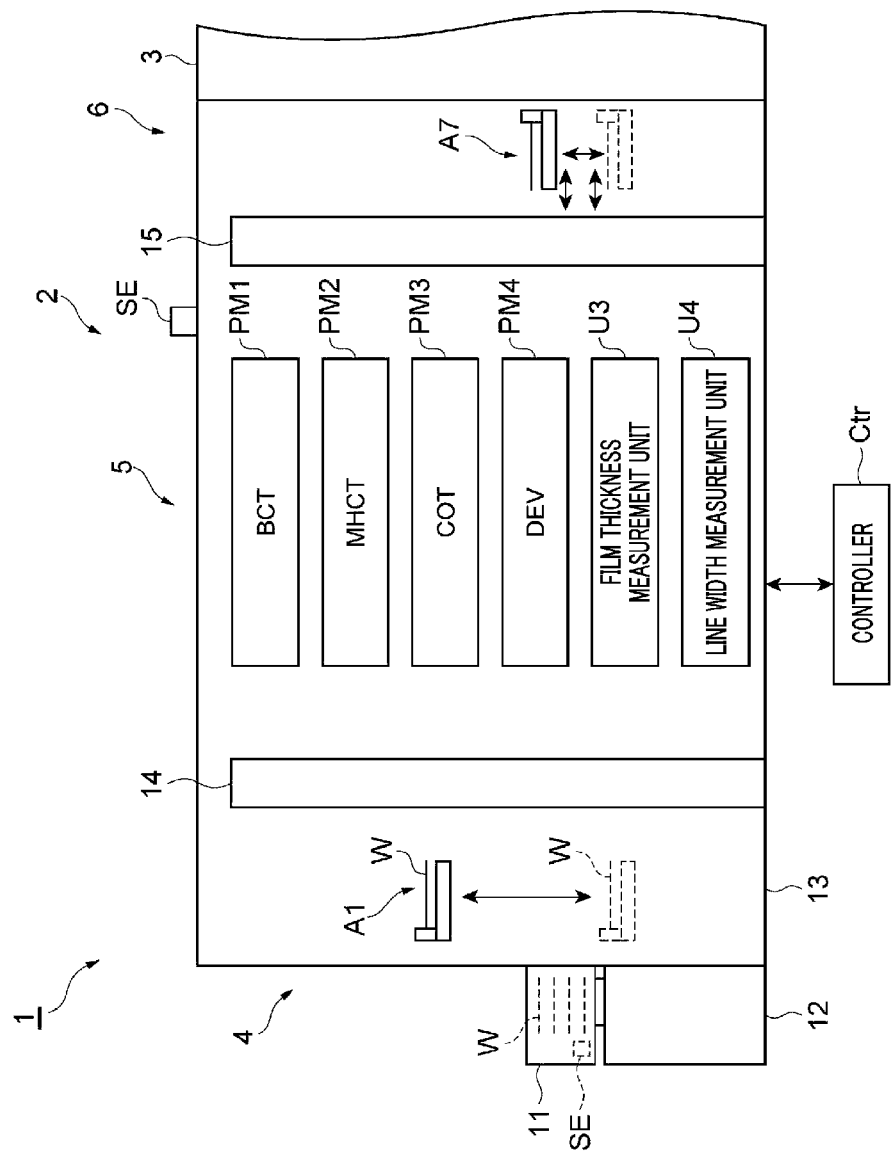
FIG. 2 is a schematic side view illustrating an inside of the substrate processing system of FIG. 1.
Figure 3:
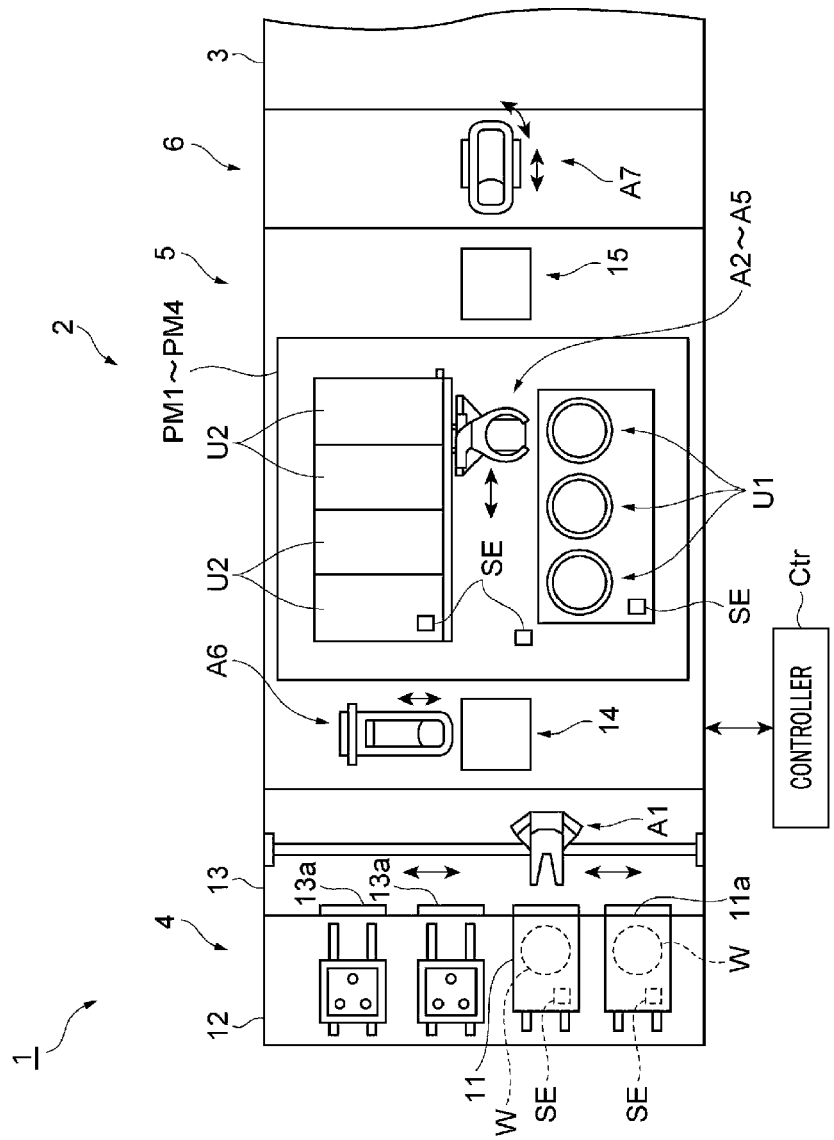
FIG. 3 is a schematic top view illustrating the inside of the substrate processing system of FIG. 1.

As shown in FIG. 1 to FIG. 3, the coating and developing apparatus 2 includes a carrier block 4, a processing block 5 and an interface block 6. The carrier block 4, the processing block 5 and the interface block 6 are horizontally arranged.

The carrier block 4 includes a carrier station 12 and a carry-in/out unit 13. The carrier station 12 supports thereon a plurality of carriers 11 (containers). Each carrier 11 can airtightly accommodate therein at least one substrate W. A side surface 11a of the carrier 11 is provided with an opening/closing door (not shown) through which the substrate W is carried into/out from the carrier 11. The carrier 11 is detachably provided on the carrier station 12 such that the side surface 11a faces the carry-in/out unit 13.

The carry-in/out unit 13 is positioned between the carrier station 12 and the processing block 5. The carry-in/out unit 13 has a plurality of opening/closing doors 13a as shown in FIG. 1 and FIG. 3. When the carrier 11 is placed on the carrier station 12, the opening/closing door of the carrier 11 faces the opening/closing door 13a. By simultaneously opening the opening/closing door 13a and the opening/closing door provided at the side surface 11a, the inside of the carrier 11 and the inside of the carry-in/out unit 13 communicate with each other. The carry-in/out unit 13 includes a transfer arm A1 as shown in FIG. 2 and FIG. 3. The transfer arm A1 takes the substrate W out from the carrier 11 to deliver it to the processing block 5 as well as receives the substrate W from the processing block 5 to return it into the carrier 11.

The processing block 5 includes processing modules PM1 to PM4, a film thickness measurement unit U3 (processing chamber) and a line width measurement unit U4 (processing chamber) as shown in FIG. 2.

The processing module PM1 is a BCT module configured to form a lower film on the surface of the substrate W. The processing module PM1 includes a liquid processing unit U1 (processing chamber), a thermal processing unit U2 (processing chamber) and a transfer arm A2 configured to transfer the substrate W to these units U1 and U2. The liquid processing unit U1 of the processing module PM1 may be configured to, for example, coat a coating liquid for forming the lower film to the substrate W. The thermal processing unit U2 of the processing module PM1 may be configured to, for example, perform a thermal processing configured to form the lower film by hardening the coating film formed on the substrate W by the liquid processing unit U1. The lower film may be, for example, an antireflection (SiARC) film.

The processing module PM2 is an HMCT module configured to form an intermediate film (hard mask) on the lower film. The processing module PM2 includes a liquid processing unit U1, a thermal processing unit U2 and a transfer arm A3 configured to transfer the substrate W to these units U1 and U2. The liquid processing unit U1 of the processing module PM2 may be configured to, for example, coat a coating liquid for forming the intermediate film to the substrate W. The thermal processing unit U2 of the processing module PM2 may be configured to, for example, perform a thermal processing configured to form the intermediate film by hardening the coating film formed on the substrate W by the liquid processing unit U1. The intermediate film may be, for example, an SOC (Spin On Carbon) film or an amorphous carbon film.

The processing module PM3 is a COT module configured to form a thermosetting and photosensitive resist film R on the intermediate film. The processing module PM3 includes a liquid processing unit U1, a thermal processing unit U2 and a transfer arm A4 configured to transfer the substrate W to these units U1 and U2. The liquid processing unit U1 of the processing module PM3 may be configured to, for example, coat a coating liquid for forming the resist film to the substrate W. The thermal processing unit U2 of the processing module PM3 may be configured to, for example, perform a thermal processing (PAB: Pre Applied Bake) configured to form the resist film R by hardening the coating film formed on the substrate W by the liquid processing unit U1.

The processing module PM4 is a DEV module configured to develop the exposed resist film R. The processing module PM4 includes a liquid processing unit U1, a thermal processing unit U2 and a transfer arm A5 configured to transfer the substrate W to these units U1 and U2. The liquid processing unit U1 of the processing module PM4 may be configured to, for example, partially remove the resist film R to form a resist pattern (not shown). The thermal processing unit U2 of the processing module PM4 may be configured to, for example, perform a thermal processing before the developing (PEB: Post Exposure Bake), a thermal processing after the developing (PB: Post Bake) and the like.

The film thickness measurement unit U3 is configured to measure the film thickness of the resist film R formed on the front surface Wa of the substrate W by the processing module PM3. The line width measurement unit U4 is configured to measure the line width of the resist pattern formed on the front surface Wa of the substrate W by the processing module PM4. The film thickness measurement unit U3 may be provided as one body with the line width measurement unit U4. That is, the film thickness and the line width may be measured by a single unit. The film thickness measurement unit U3 may measure the film thickness, for example, based on an image taken with a camera or may measure the film thickness by radiating a laser beam or the like. Likewise, the line width measurement unit U4 may measure the line width, for example, based on an image taken with a camera or may measure the line width by radiating a laser beam or the like.

As shown in FIG. 2 and FIG. 3, the processing block 5 includes a shelf unit 14 located near the carrier block 4. The shelf unit 14 extends in a vertical direction and includes a plurality of cells arranged in the vertical direction. A transfer arm A6 is provided near the shelf unit 14. The transfer arm A6 is configured to move the substrate W up and down among the cells of the shelf unit 14.

The processing block 5 includes a shelf unit 15 located near the interface block 6. The shelf unit 15 extends in the vertical direction and includes a plurality of cells aligned in the vertical direction.

The interface block 6 includes a transfer arm A7, and is connected to the exposure apparatus 3. The transfer arm A7 is configured to take the substrate W out from the shelf unit 15 to deliver it to the exposure apparatus 3 as well as receive the substrate W from the exposure apparatus 3 to return it into the shelf unit 15.

As shown in FIG. 1 to FIG. 3, a sensor unit SE (sensor) may be placed inside or outside the coating and developing apparatus 2. The sensor unit SE placed outside the coating and developing apparatus 2 may be provided at an outer wall surface of the coating and developing apparatus 2 as shown in FIG. 1 or FIG. 2.

The sensor unit SE placed inside the coating and developing apparatus 2 may be located at a place where the substrate W can be present within the coating and developing apparatus 2 as shown in FIG. 2 or FIG. 3. For example, the sensor unit SE may be placed inside the carrier 11, inside the liquid processing units U1 of the processing modules PM1 to PM4, inside the thermal processing units U2 of the processing modules PM1 to PM4, inside the cells of the shelf units 14 and 15 or in a transfer route (i.e., outside each unit U1 to U4) for the substrate W transferred by the transfer arms A1 to A7.

The sensor unit SE may include, for example, at least one sensor selected from the group consisting of a temperature sensor, a humidity sensor, an atmospheric pressure sensor, a wind speed sensor, a differential pressure sensor, a thermography camera and a viscosity sensor. The temperature sensor may be configured to measure the temperature of the surrounding environment. The humidity sensor may be configured to measure the relative humidity of the surrounding environment. The atmospheric pressure sensor may be configured to measure the atmospheric pressure of the surrounding environment. The wind speed sensor may be configured to measure the wind speed of the surrounding environment. The differential pressure sensor may be configured to measure a pressure difference between the inside and the outside of the coating and developing apparatus 2 (for example, a pressure difference between the inside of each of the units U1 to U4 and the outside of the coating and developing apparatus 2). The thermography camera may be configured to measure the temperature distribution of, for example, the substrate W and a cooling plate 81 (which will be described later) within the thermal processing unit U2. The viscosity sensor may be configured to measure the viscosity of the resist liquid used in the processing module PM3.

The coating and developing apparatus 2 further includes a display 16 (display device). The display 16 is configured to display various kinds of information on the screen. The information displayed by the display 16 may include, for example, processing conditions for the substrate W (for example, predetermined recipes, conditions calculated by the controller Ctr, etc.), images of the substrate W, data acquired by the sensor unit SE (pre-data, post-data), film thickness data measured by the film thickness measurement unit U3 (film thickness measurement values), line width data measured by the line width measurement unit U4 (line width measurement values) and various data analysis results acquired by the controller Ctr (for example, predicted film thickness, predicted line width, film thickness model, line width model, etc.).

The controller Ctr is configured to partly or wholly control the coating and developing apparatus 2. Details of the controller Ctr will be described later. The controller Ctr may be configured to entirely control the substrate processing system 1 by transmitting and receiving a signal to and from a controller of the exposure apparatus 3 in association with the controller of the exposure apparatus 3.

[Liquid Processing Unit]

Figure 4:
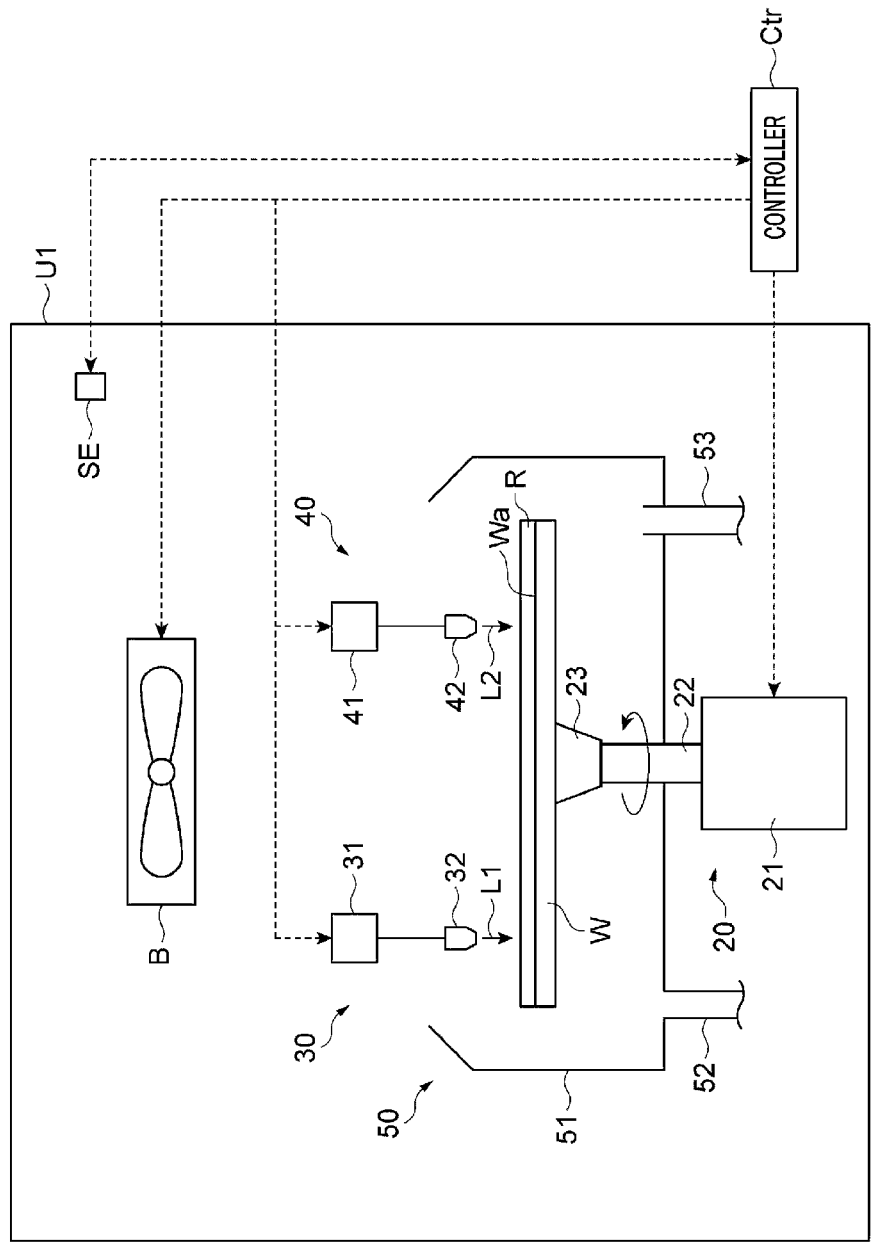
FIG. 4 is a schematic side view illustrating an example of a liquid processing unit.

Next, the liquid processing unit U1 will be described in more detail with reference to FIG. 4. The liquid processing unit U1 is equipped with a substrate holder 20, a liquid supply 30, a liquid supply 40, a cover member 50 and a blower B.

The substrate holder 20 has a rotator 21, a shaft 22 and a holder 23. The rotator 21 is configured to operate based on an operating signal from the controller Ctr to rotate the shaft 22. The rotator 21 serves as a power source, e.g., an electric motor. The holder 23 is disposed on a tip end of the shaft 22. The substrate W is placed on the holder 23. The holder 23 is configured to substantially horizontally hold the substrate W by, for example, attraction. That is, the substrate holder 20 rotates the substrate W about a central axis (rotation axis) that is perpendicular to the front surface Wa of the substrate W while the substrate W is in a substantially horizontal posture. Within the liquid processing unit U1, the sensor unit SE may be placed above the substrate holder 20.

The liquid supply 30 is configured to supply a processing liquid L1 onto the front surface Wa of the substrate W. The processing liquid L1 in the processing module PM1 may be, for example, the coating liquid for forming the lower film. The processing liquid L1 in the processing module PM2 may be, for example, the coating liquid for forming the intermediate film. The processing liquid L1 in the processing module PM3 may be, for example, the resist liquid for forming the resist film R. The processing liquid L1 in the processing module PM4 may be, for example, a developer. A resist material contained in the resist liquid may be a positive resist material or a negative resist material. In the positive resist material, a pattern-exposed portion is dissolved while a pattern-unexposed portion (light-shielded portion) remains. In the negative resist material, a pattern-unexposed portion (light-shielded portion) is dissolved while a pattern-exposed portion remains.

The liquid supply 30 includes a supply device 31 and a nozzle 32. The supply device 31 is configured to supply the processing liquid L1 stored in a container (not shown) by a liquid feeding device such as a pump (not shown) based on a signal from the controller Ctr. The supply device 31 is configured to move the nozzle 32 in a height direction and a horizontal direction based on a signal from the controller Ctr. The nozzle 32 is configured to discharge the processing liquid L1 supplied from the supply device 31 onto the front surface Wa of the substrate W.

The liquid supply 40 is configured to supply the processing liquid L2 onto the front surface Wa of the substrate W. The processing liquid L2 in the processing module PM1 may be, for example, a chemical liquid (e.g., organic solvent) for removing a peripheral portion of the lower film. The processing liquid L2 in the processing module PM2 may be, for example, a chemical liquid (e.g., organic solvent) for removing a peripheral portion of the intermediate film. The processing liquid L2 in the processing module PM3 may be, for example, a chemical liquid (e.g., organic solvent) for removing a peripheral portion of the resist film R or a chemical liquid (e.g., organic solvent) to be supplied onto the front surface Wa of the substrate W before the resist liquid is coated, in order to improve the flowability of the resist liquid on the front surface Wa of the substrate. The processing liquid L2 in the processing module PM4 may be, for example, a rinse liquid.

The liquid supply 40 includes a supply device 41 and a nozzle 42. The supply device 41 is configured to supply the processing liquid L2 stored in a container (not shown) by a liquid feeding device such as a pump (not shown) based on a signal from the controller Ctr. The supply device 41 is configured to move the nozzle 42 in the height direction and the horizontal direction based on a signal from the controller Ctr. The nozzle 42 is configured to discharge the processing liquid L2 supplied from the supply device 41 onto the front surface Wa of the substrate W.

The cover member 50 is provided around the substrate holder 20. The cover member 50 includes a main body 51, a drain port 52 and an exhaust port 53. The main body 51 is configured as a liquid recovery cup configured to receive the processing liquids L1 and L2 supplied onto the substrate W to process the substrate W. The drain port 52 is provided at a bottom portion of the main body 51 and configured to drain the liquid collected by the main body 51 to the outside of the liquid processing unit U1. The exhaust port 53 is provided at a bottom portion of the main body 51 and configured to exhaust a descending flow (down flow) flowing around the substrate W to the outside of the liquid processing unit U1.

In the liquid processing unit U1, the blower B is placed above the substrate holder 20 and the cover member 50. The blower B is configured to form the descending flow toward the cover member 50 based on a signal from the controller Ctr.

[Configuration of Thermal Processing Unit]

Figure 5:
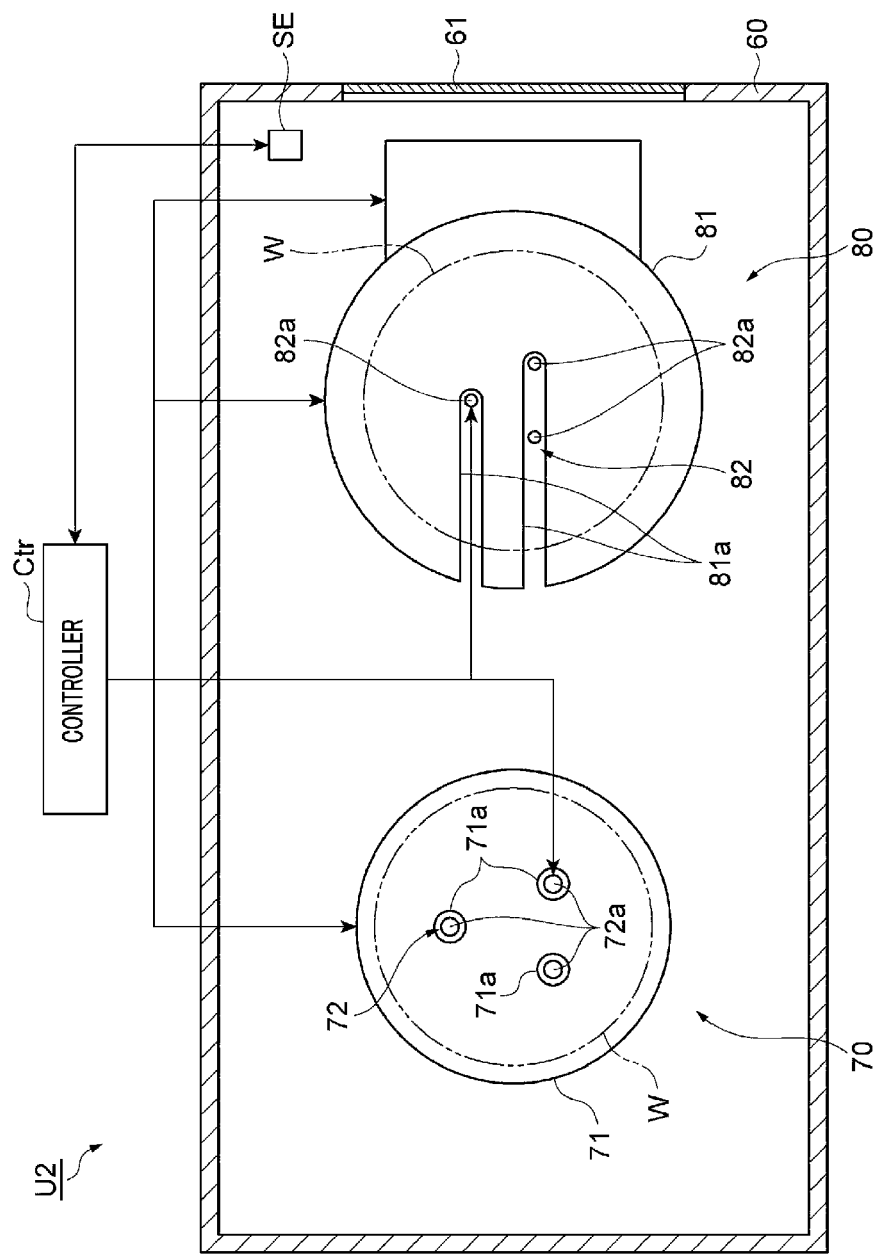
FIG. 5 is a schematic top view illustrating an example of a thermal processing unit.

Next, the configuration of the thermal processing unit U2 will be described with reference to FIG. 5. The thermal processing unit U2 includes a heater 70 configured to heat the substrate W and a cooler 80 configured to cool the substrate W within a housing 60. The housing 60 is equipped with a carry-in/out opening 61 for the substrate W near the cooler 80. Within the housing 60, the sensor unit SE may be placed near the carry-in/out opening 61. The differential pressure sensor of the sensor unit SE may be placed at an opposite side from the carry-in/out opening 61 of the housing 60.

The heater 70 includes a heating plate 71 and an elevating mechanism 72. The heating plate 71 is configured to heat the substrate W placed on the top surface thereof based on an instruction from the controller Ctr. The elevating mechanism 72 has three elevating pins 72a configured to be moved up and down based on an instruction from the controller Ctr. The elevating pins 72a are inserted through through-holes 71a, respectively, formed through the heating plate 71.

The cooler 80 includes a cooling plate 81 and an elevating mechanism 82. The cooling plate 81 is configured to cool the substrate W placed on a top surface thereof based on an instruction from the controller Ctr. The cooling plate 81 is configured to be movable between near the carry-in/out opening 61 and near the heating plate 71 based on an instruction from the controller Ctr. The elevating mechanism 82 has three elevating pins 82a configured to be moved up and down based on an instruction from the controller Ctr. The elevating pins 82a are inserted through slits 81a, respectively, formed through the cooling plate 81.

When the substrate W is carried into the thermal processing unit U2, the elevating pins 82a are moved up by the elevating mechanism 82 so that tip ends of the elevating pins 82a can protrude above the cooling plate 81. Then, when the substrate W carried into the housing 60 is placed on the tip ends of the elevating pins 82a, the elevating pins 82a are moved down to below the cooling plate 81 by the elevating mechanism 82. Thus, the substrate W is delivered from the elevating pins 82a to the cooling plate 81.

Then, the cooling plate 81 is moved to above the heating plate 71. In this state, the elevating pins 72a are moved up by the elevating mechanism 72 so that tip ends of the elevating pins 72a can protrude above the cooling plate 81. Thus, the substrate W is delivered from the cooling plate 81 to the elevating pins 72a. Thereafter, the cooling plate 81 is moved to near the carry-in/out opening 61. In this state, the elevating pins 72a are moved down to below the heating plate 71 by the elevating mechanism 72. Thus, the substrate W is delivered from the elevating pins 72a to the heating plate 71. When the substrate W is carried out from the thermal processing unit U2, the above-described operations are performed in reverse order.

[Details of Controller]

Figure 6:
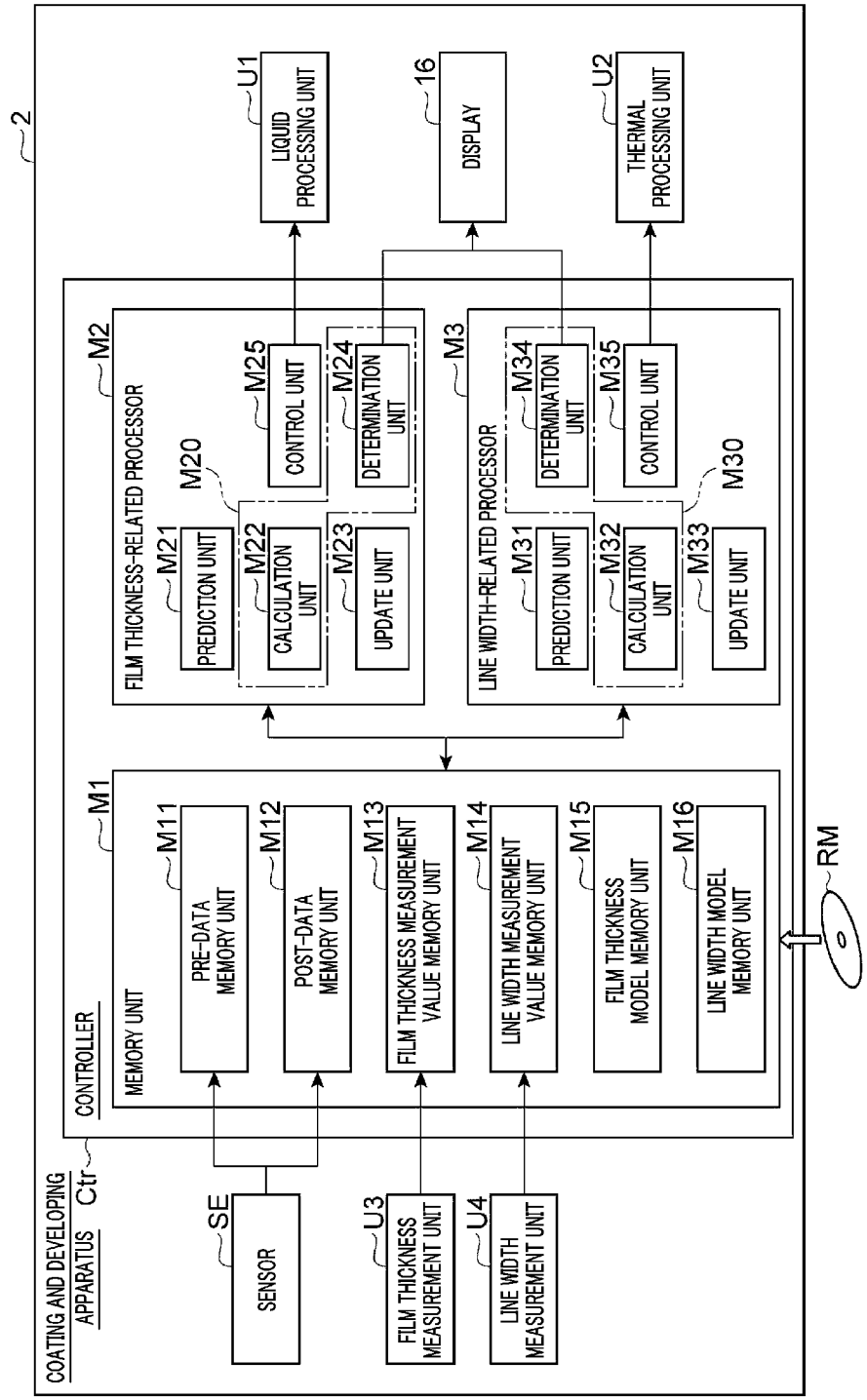
FIG. 6 is a block diagram illustrating an example of the substrate processing system.

Next, details of the controller Ctr will be described with reference to FIG. 6 to FIG. 8. As shown in FIG. 6, the controller Ctr includes, as functional modules, a memory unit M1, a film thickness-related processor M2 and a line width-related processor M3. These functional modules are just modules divided corresponding to the respective functions of the controller Ctr for the sake of convenience, and it does not necessarily imply that hardware of the controller Ctr is divided into these modules. Each functional module is not limited to being implemented by execution of a program but may be implemented by a dedicated electrical circuit (for example, a logic circuit) or an ASIC (Application Specific Integrated Circuit) thereof.

The memory unit M1 is configured to store various data. The memory unit M1 may store, for example, a program read from a computer-readable recording medium RM and setting data input from an operator via an external input device (not shown). The program may be configured to operate each component of the coating and developing apparatus 2. The recording medium RM may be, for example, a semiconductor memory, an optical recording disk, a magnetic recording disk or a magneto-optical recording disk.

The memory unit M1 may include, as functional modules, a pre-data memory unit M11, a post-data memory unit M12, a film thickness measurement value memory unit M13, a line width measurement value memory unit M14, a film thickness model memory unit M15 and a line width model memory unit M16.

The pre-data memory unit M11 may be configured to store, as pre-data, data measured by the sensor unit SE before the substrate W is processed. The pre-data memory unit M11 may be configured to store, as pre-data, for example, data measured by the sensor unit SE at a time point when the carrier 11 in which the substrate W is accommodated is placed on the carrier station 12 of the coating and developing apparatus 2.

The post-data memory unit M12 may be configured to store, as post-data, data measured by the sensor unit SE after the substrate W is processed. The post-data memory unit M12 may be configured to store, as post-data after a liquid processing, for example, data measured by the sensor unit SE at a time point after the liquid processing unit U1 performs the liquid processing onto the substrate W. The time point after the liquid processing may include, for example, a time point after the resist film R is formed on the front surface Wa of the substrate W, a time point after the resist film R is developed and the resist pattern is formed on the front surface Wa of the substrate W and the like. The post-data memory unit M12 may be configured to store, as post-data after a thermal processing, for example, data measured by the sensor unit SE at a time point after the thermal processing unit U2 performs the thermal processing onto the substrate W.

The film thickness measurement value memory unit M13 may be configured to store the film thickness of the resist film R measured by the film thickness measurement unit U3. The line width measurement value memory unit M14 may be configured to store the line width of the resist pattern measured by the line width measurement unit U4.

The film thickness model memory unit M15 may be configured to store a film thickness model representing a relationship between a state of the coating and developing apparatus 2 and a film thickness prediction value (predicted film thickness) of the resist film R formed on the front surface Wa of the substrate W by the coating and developing apparatus 2. The film thickness model may be, for example, a model empirically obtained by processing substrates W under different processing conditions and acquiring the film thicknesses of the resist films R, a model physically obtained by using a simulation on a computer or a model in which these models are combined. Otherwise, the film thickness model may be a model created by machine learning based on learning data which are accumulated records in which the state of the coating and developing apparatus 2 corresponds to the film thickness of the resist film R formed on the front surface Wa of the substrate W by the coating and developing apparatus 2. The film thickness model includes, for example, a multiple regression equation developed through the multiple regression analysis. If parameters y, $a_1$ to $a_k$, $\alpha_1$ to $\alpha_k$, e and k are defined as follows, the multiple regression equation of the film thickness may be expressed by the following Equation 1.

y: objective variable (predicted film thickness)
$a_1$ to $a_k$: explanatory variables (processing conditions of the substrate W)
$\alpha_1$ to $\alpha_k$: partial regression coefficients
e: error
k: natural number of 2 or more, and $$y = \alpha_1 \cdot a_1 + \alpha_2 \cdot a_2 + \ldots + \alpha_k \cdot a_k + e \quad \text{(Equation 1)}$$

The line width model memory unit M16 may be configured to store a line width model representing the relationship between the state of the coating and developing apparatus 2 and a line width prediction value (predicted line width) of the resist pattern formed on the front surface Wa of the substrate W by the coating and developing apparatus 2. The line width model may be, for example, a model empirically obtained by processing substrates W under different processing conditions and acquiring the line widths of the resist patterns, a model physically obtained by using a simulation on a computer or a model in which these models are combined. Otherwise, the line width model may be a model created by machine learning based on learning data which are accumulated records in which the state of the coating and developing apparatus 2 corresponds to the film thickness of the resist pattern formed on the front surface Wa of the substrate W by the coating and developing apparatus 2. The line width model includes, for example, a multiple regression equation developed through multiple regression analysis. If parameters z, $b_1$ to $b_m$, $\beta_1$ to $\beta_m$, f and m are defined as follows, the multiple regression equation of the film thickness may be expressed by the following Equation 1.

z: objective variable (predicted line width)
$B_1$ to $b_m$: explanatory variables (processing conditions of the substrate W)
$\beta_1$ to $\beta_m$: partial regression coefficients
f: error
m: 2 natural number of 2 or more, and $$z = \beta_1 \cdot b_1 + \beta_2 \cdot b_2 + \ldots + \beta_k \cdot b_k + f \quad \text{(Equation 2)}$$

The partial regression coefficients $\alpha_1$ to $\alpha_k$ may include at least one selected from the group consisting of a value depending on the temperature of the surrounding environment of the substrate W being processed, a value depending on the relative humidity of the surrounding environment of the substrate W being processed, a value depending on the atmospheric pressure of the surrounding environment of the substrate W being processed, a value depending on the wind speed of the surrounding environment of the substrate W being processed, a value depending on the viscosity of a resist liquid applied onto the substrate W, a value depending on the kind of the organic solvent supplied to the substrate W, a value depending on the temperature distribution of the substrate W, a value depending on the pressure difference between the surrounding environment of the substrate W being processed and the outside of the coating and developing apparatus 2 and a value depending on the structure of the cover member 50. The same goes for the partial regression coefficients $\beta_1$ to $\beta_k$.

The film thickness-related processor M2 is configured to perform a processing configured to form the resist film R to a predetermined film thickness on the front surface Wa of the substrate W based on various data stored in the memory unit M1. The film thickness-related processor M2 includes a prediction unit M21, an output unit M20, an update unit M23 and a control unit M25 as shown in FIG. 6 and FIG. 7.

Figure 7:
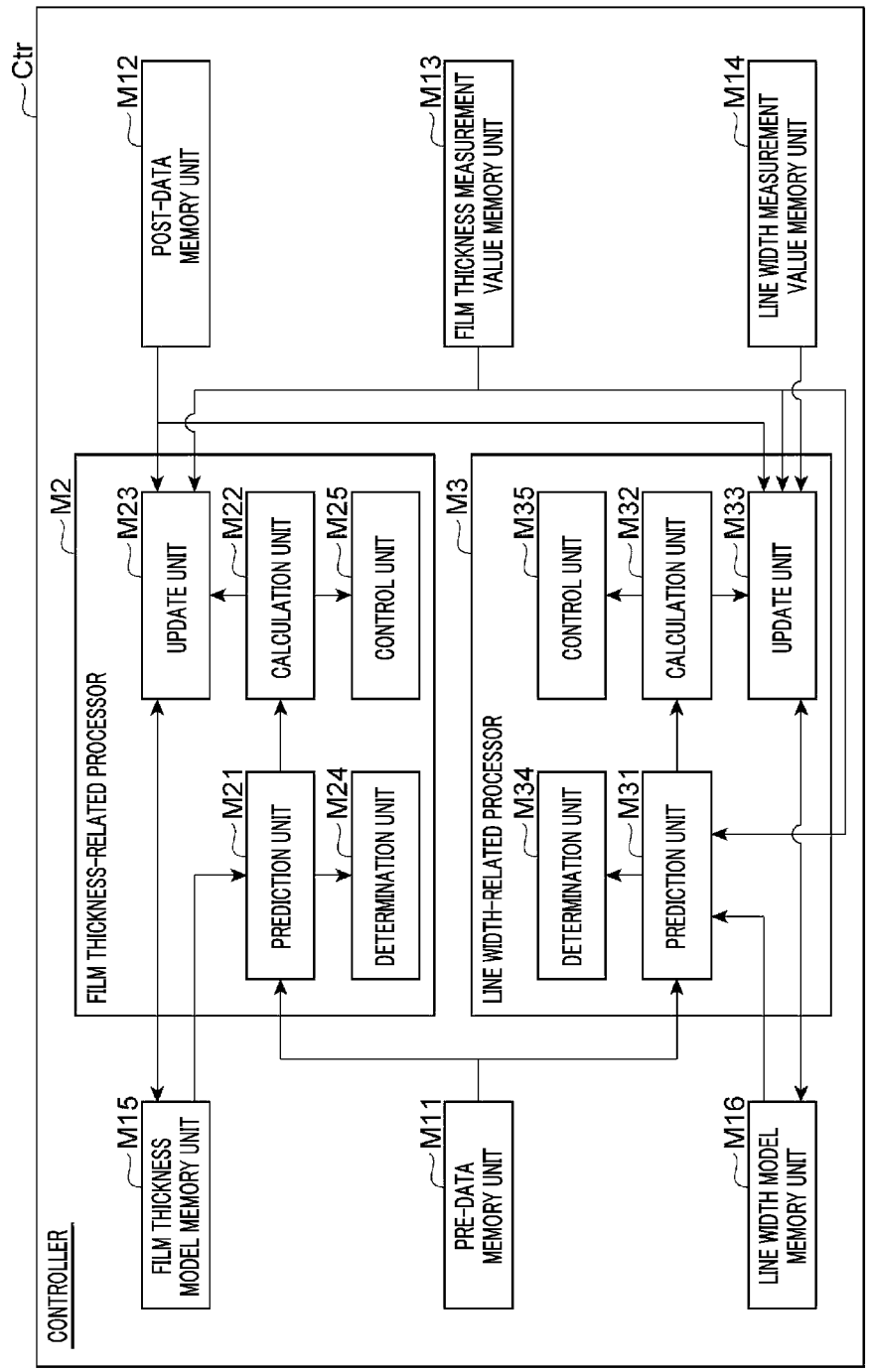
FIG. 7 is a block diagram illustrating an example of a controller.
Figure 8:
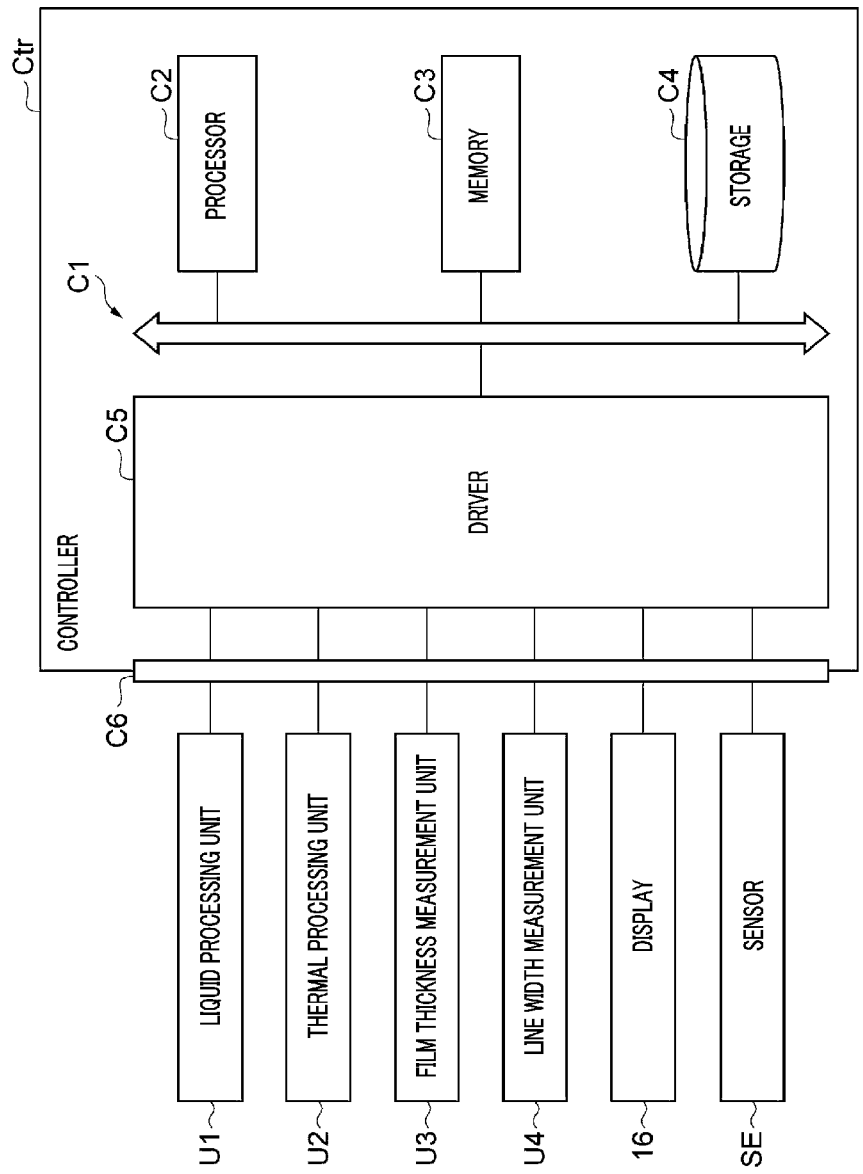
FIG. 8 is a schematic illustration of a hardware configuration of the controller.

As shown in FIG. 7, the prediction unit M21 is configured to calculate the predicted film thickness y of the resist film R to be formed on the front surface Wa of the substrate W based on the pre-data stored in the pre-data memory unit M11 and the film thickness model (Equation 1) stored in the film thickness model memory unit M15.

The output unit M20 outputs instruction information on the processing of the substrate W based on the predicted film thickness y before the substrate W is processed by the coating and developing apparatus 2. For example, the output unit M20 is equipped with a calculation unit M22 and a determination unit M24.

The calculation unit M22 is configured to calculate a processing condition of the substrate W suitable for obtaining, based on the predicted film thickness y calculated by the prediction unit M21, the corresponding predicted film thickness y. The processing condition is an example of the above-described instruction information. The processing condition may be, for example, the rotation number of the substrate W rotated by the substrate holder 20 in the liquid processing unit U1 of the processing module PM3. There is a predetermined correlation between the rotation number of the substrate W and the film thickness of the resist film R obtained at the corresponding rotation number, and, thus, an equation for the correlation may be previously obtained by experiments. The calculation unit M22 may calculate the rotation number of the substrate W to be processed by applying the predicted film thickness y to the corresponding equation.

The determination unit M24 is configured to output instruction information indicating whether or not to continue the processing of the substrate W (hereinafter, referred to as "continuance or non-continuance information") based on the predicted film thickness y calculated by the prediction unit M21. The determination unit M24 may output the continuance or non-continuance information based on, for example, whether the predicted film thickness y calculated by the prediction unit M21 is within a range of a predetermined design value. For example, the determination unit M24 may be configured to display the continuance or non-continuance information on the display 16 as shown in FIG. 6.

The update unit M23 is configured to update the film thickness model stored in the film thickness model memory unit M15 based on the post-data stored in the post-data memory unit M12 and the film thickness measurement value stored in the film thickness measurement value memory unit M13. The update unit M23 is configured to, for example, add the post-data and the film thickness measurement value to calculate the partial regression coefficients $\alpha_1$ to $\alpha_k$ again. The updated film thickness model is stored in the film thickness model memory unit M15. The update unit M23 may further use the processing condition calculated by the calculation unit M22 to update the film thickness model.

As shown in FIG. 6 and FIG. 7, the control unit M25 is configured to control the coating and developing apparatus 2 based on the processing condition calculated by the calculation unit M22. The control unit M25 may control the substrate holder 20 in the liquid processing unit U1 to, for example, rotate the substrate W at the rotation number of the substrate W calculated by the calculation unit M22. Further, the determination unit M24 may output the continuance or non-continuance information to the control unit M25. If the continuance or non-continuance information output from the determination unit M24 to the control unit M25 indicates non-continuance, the control unit M25 may control the coating and developing apparatus 2 to stop processing the substrate W.

The line width-related processor M3 is configured to perform a processing configured to form the resist pattern to a predetermined line width on the front surface Wa of the substrate W based on the various data stored in the memory unit M1. The line width-related processor M3 includes a prediction unit M31, an output unit M30, an update unit M33 and a control unit M35 as shown in FIG. 6 and FIG. 7.

As shown in FIG. 7, the prediction unit M31 is configured to calculate a predicted line width z of the resist pattern to be formed on the front surface Wa of the substrate W based on the pre-data stored in the pre-data memory unit M11 and the line width model (Equation 2) stored in the line width model memory unit M16. The prediction unit M31 may further use the film thickness measurement value stored in the film thickness measurement value memory unit M13 to calculate the predicted line width z.

The output unit M30 outputs instruction information on the processing of the substrate W based on the predicted line width z before the substrate W is processed by the coating and developing apparatus 2. For example, the output unit M30 is equipped with a calculation unit M32 and a determination unit M34.

The calculation unit M32 is configured to calculate a processing condition of the substrate W suitable for obtaining, based on the predicted line width z calculated by the prediction unit M31, the corresponding predicted line width z. The processing condition is an example of the above-described instruction information. The processing condition may be, for example, the temperature for thermal processing (PEB) ("PEB temperature") in the thermal processing unit U2 of the processing module PM4. There is a predetermined correlation between the PEB temperature and the line width of the resist pattern obtained at the corresponding PEB temperature, and, thus, an equation for the correlation may be previously obtained by experiments. The calculation unit M32 may calculate the PEB temperature of the substrate W to be processed by applying the predicted line width z to the corresponding equation.

The determination unit M34 is configured to output instruction information indicating whether or not to continue the processing of the substrate W (hereinafter, referred to as "continuance or non-continuance information") based on the predicted line width z calculated by the prediction unit M31. The determination unit M34 may output the continuance or non-continuance information based on, for example, whether the predicted line width z calculated by the prediction unit M31 is within a range of a predetermined design value. For example, the determination unit M34 may be configured to display the continuance or non-continuance information on the display 16 as shown in FIG. 6.

The update unit M33 is configured to update the line width model stored in the line width model memory unit M16 based on the post-data stored in the post-data memory unit M12 and the line width measurement value stored in the line width measurement value memory unit M14. The update unit M33 is configured to, for example, add the post-data and the line width measurement value to calculate the partial regression coefficients $\beta_1$ to $\beta_m$ again. The updated line width model is stored in the line width model memory unit M16. The update unit M33 may further use the processing condition calculated by the calculation unit M32 and the film thickness measurement value stored in the film thickness model memory unit M15 to update the line width model.

As shown in FIG. 6 and FIG. 7, the control unit M35 is configured to control the coating and developing apparatus 2 based on the processing condition calculated by the calculation unit M32. The control unit M35 may control the heating plate 71 in the thermal processing unit U2 to perform the thermal processing onto the substrate W at the PEB temperature calculated by the calculation unit M32. Further, the determination unit M34 may output the continuance or non-continuance information to the control unit M35. If the continuance or non-continuance information output from the determination unit M34 to the control unit M35 indicates non-continuance, the control unit M35 may control the coating and developing apparatus 2 to stop processing the substrate W.

The hardware of the controller Ctr may be composed of, for example, one or more control computers. As shown in FIG. 8, the controller Ctr has a circuit C1 as a hardware component. The circuit C1 may be composed of circuitry elements. The circuit C1 may include a processor C2 (prediction unit, determination unit, update unit, calculation unit, controller), a memory C3 (memory unit), a storage C4 (memory unit), a driver C5 and an input/output port C6.

The processor C2 cooperates with at least one of the memory C3 and the storage C4 to execute a program and execute input/output of signals via the input/output port C6 so as to compose each functional module described above. The memory C3 and the storage C4 function as the memory unit M1. The driver C5 is a circuit configured to drive various devices of the coating and developing apparatus 2. The input/output port C6 performs the input/output of the signals between the driver C5 and various devices (for example, the liquid processing unit U1, the thermal processing unit U2, the film thickness measurement unit U3, the line width measurement unit U4, the display 16, the sensor unit SE, etc.) of the coating and developing apparatus 2.

The substrate processing system 1 may include one controller Ctr, or may include a controller group (control unit) including controllers Ctr. When the substrate processing system 1 includes the controller group, each of the above-described functional modules may be implemented by one controller Ctr, or may be implemented by a combination of two or more controllers Ctr. When the controller Ctr is composed of the computers (circuit C1), each of the above-described functional modules may be implemented by one computer (circuit C1), or may be implemented by a combination of two or more computers (circuit C1). The controller Ctr may have a plurality of processors C2. In this case, each of the above-described functional modules may be implemented by one processor C2 or may be implemented by a combination of two or more processors C2. Some of the functions of the controller Ctr of the substrate processing system 1 may be provided to separate devices from the substrate processing system 1 and the separate devices may be connected to the substrate processing system 1 via a network to implement various operations according to the present exemplary embodiment. For example, if the functions of the processors C2, the memories C3 and the storages C4 of the substrate processing systems 1 are implemented by one or more separate devices, it is possible to remotely manage and control information and operations of the plurality of substrate processing systems 1 in a batch manner.

[Processing for Forming Resist Film]

Next, a method of forming the resist film Ron the front surface Wa of the substrate W will be described with reference to FIG. 7 and FIG. 9.

First, when a processing of the substrate W is started, at least one sensor unit SE provided inside or outside the coating and developing apparatus 2 measures data and transmits the data to the pre-data memory unit M11. Thus, the pre-data memory unit M11 acquires the pre-data (process S11 of FIG. 9). The pre-data may be acquired at any time from when the carrier 11 carrying the substrate W as the target object on which the resist film is to be formed is placed on the carrier station 12 to when the resist liquid is supplied to the front surface Wa of the substrate W.

Figure 9:
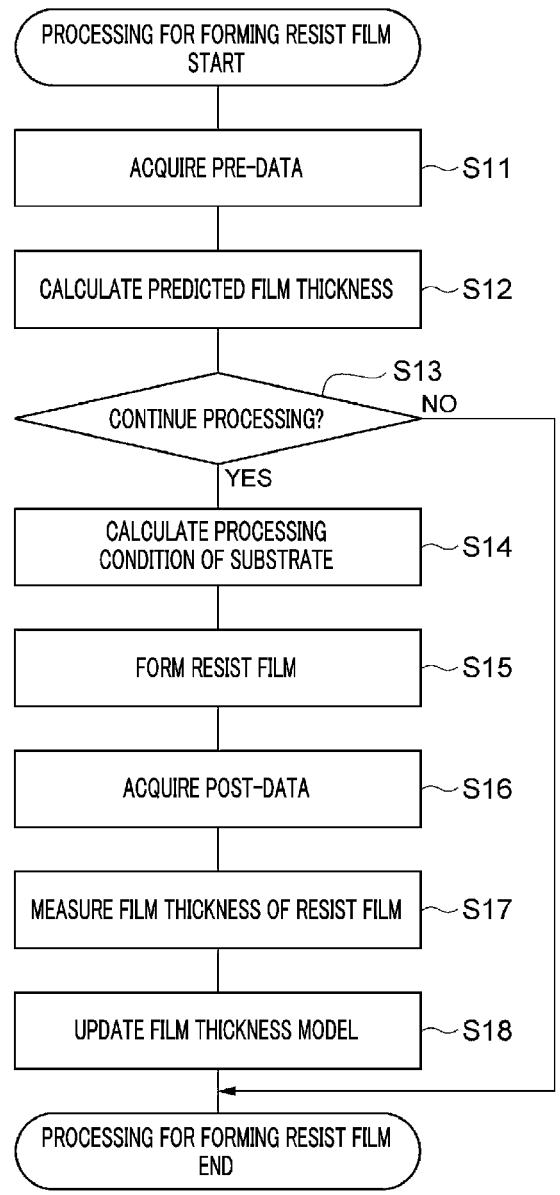
FIG. 9 is a flowchart showing an example of a sequence for forming a resist film on a surface of a substrate.

Then, the prediction unit M21 calculates the predicted film thickness y of the resist film R based on the pre-data stored in the pre-data memory unit M11 and the film thickness model (Equation 1) stored in the film thickness model memory unit M15 (process S12 of FIG. 9). Thereafter, the determination unit M24 outputs, to the control unit M25, the continuance or non-continuance information indicating whether or not to continue processing the substrate W based on the predicted film thickness y calculated by the prediction unit M21 (process S13 of FIG. 9). If the continuance or non-continuance information indicates the non-continuance (NO in the process S13 of FIG. 9), the control unit M25 stops the coating and developing apparatus 2. Thus, the resist film R is not formed on the substrate W and the processing is ended.

Meanwhile, if the continuance or non-continuance information indicates the continuance (YES in the process S13 of FIG. 9), the calculation unit M22 calculates the processing condition (rotation number) of the substrate W based on the predicted film thickness y calculated by the prediction unit M21 (process S14 of FIG. 9). Then, the control unit M25 controls the liquid processing unit U1 of the processing module PM3 based on the processing condition calculated by the calculation unit M22. Thus, the resist film R is formed to a predetermined film thickness (corresponding to the predicted film thickness y) on the front surface Wa of the substrate W (process S15 of FIG. 9).

Thereafter, at least one sensor unit SE provided inside or outside the coating and developing apparatus 2 measures data and transmits the data to the post-data memory unit M12. Thus, the post-data memory unit M12 acquires the post-data (process S16 of FIG. 9). The post-data may be acquired at any time from when the resist film R is formed on the front surface Wa of the substrate W to when a subsequent processing is performed on the substrate W.

Then, the film thickness measurement unit U3 measures the film thickness of the resist film R formed on the front surface Wa of the substrate W (process S17 of FIG. 9). The film thickness data of the resist film R (film thickness measurement value) measured by the film thickness measurement unit U3 are stored in the film thickness measurement value memory unit M13. Also, the process S16 and the process S17 may be performed simultaneously, or the process S17 may be performed before the process S16 is performed.

Thereafter, the update unit M23 updates the partial regression coefficients $\alpha_1$ to $\alpha_k$ of the film thickness model stored in the film thickness model memory unit M15 based on the post-data stored in the post-data memory unit M12 and the film thickness measurement value stored in the film thickness measurement value memory unit M13 (process S18 of FIG. 9). Thus, when a subsequent substrate W is processed, the updated film thickness model is used. Accordingly, the processing of forming the resist film R on the single substrate W is ended.

[Processing of Forming Resist Pattern]

Next, a method of forming the resist pattern on the front surface Wa of the substrate W will be described with reference to FIG. 7 and FIG. 10.

First, when a processing of the substrate W is started, at least one sensor unit SE provided inside or outside the coating and developing apparatus 2 measures data and transmits the data to the pre-data memory unit M11. Thus, the pre-data memory unit M11 acquires the pre-data (process S21 of FIG. 10). The pre-data may be acquired at any time from when the carrier 11 carrying the substrate W as the target object on which the resist pattern is to be formed is placed on the carrier station 12 to when the developer is supplied to the resist film R on the front surface Wa of the substrate W.

Figure 10:
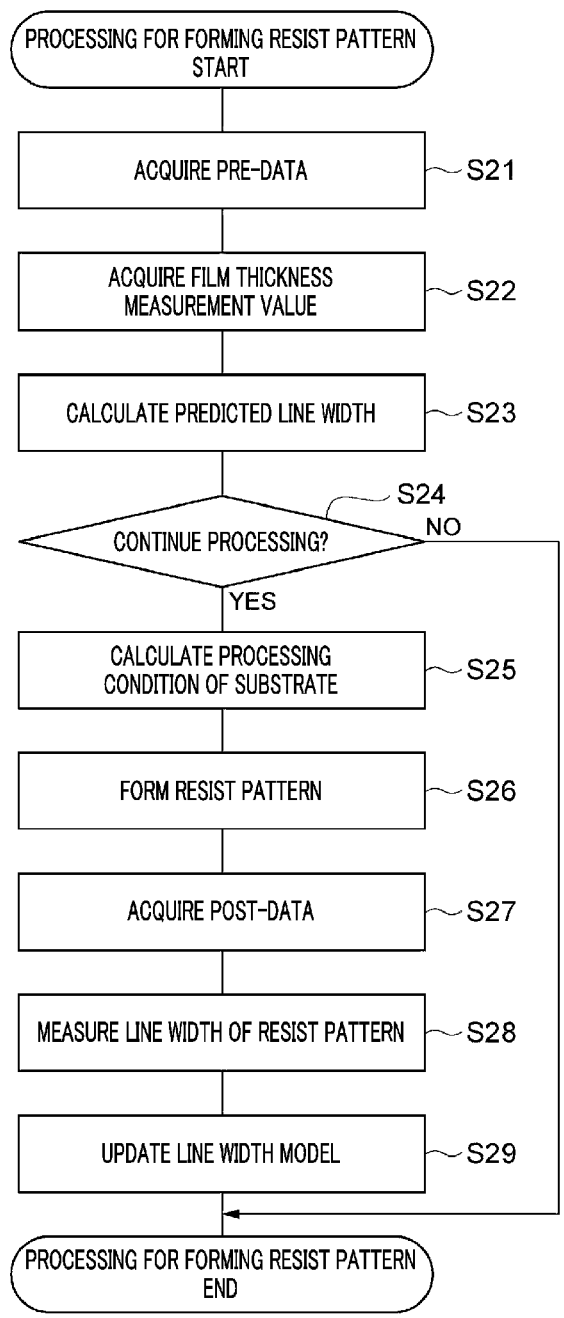
FIG. 10 is a flowchart showing an example of a sequence for forming a resist pattern on the surface of the substrate.

Then, the film thickness measurement unit U3 measures the film thickness of the resist film R formed on the front surface Wa of the substrate W (process S22 of FIG. 10). The film thickness data of the resist film R (film thickness measurement value) measured by the film thickness measurement unit U3 are stored in the film thickness measurement value memory unit M13. The film thickness measurement value may not be newly measured, but the previously measured data (data measured in the process S17 of FIG. 9) of the substrate W on which the resist pattern is to be formed may be used.

Thereafter, the prediction unit M31 calculates the predicted line width z of the resist pattern based on the pre-data stored in the pre-data memory unit M11, the line width model (Equation 2) stored in the line width model memory unit M16 and the film thickness measurement value stored in the film thickness measurement value memory unit M13 (process S23 of FIG. 10). Then, the determination unit M34 outputs, to the control unit M35, the continuance or non-continuance information indicating whether or not to continue processing the substrate W based on the predicted line width z calculated by the prediction unit M31 (process S24 of FIG. 10). If the continuance or non-continuance information indicates the non-continuance (NO in the process S24 of FIG. 10), the control unit M35 stops the coating and developing apparatus 2. Thus, the resist pattern is not formed on the substrate W and the processing is ended.

Meanwhile, if the continuance or non-continuance information indicates the continuance (YES in the process S24 of FIG. 10), the calculation unit M32 calculates the processing condition (PEB temperature) of the substrate W based on the predicted line width z calculated by the prediction unit M31 (process S25 of FIG. 10). Then, the control unit M35 controls the thermal processing unit U2 of the processing module PM4 based on the processing condition calculated by the calculation unit M32. Thus, the resist pattern is formed to a predetermined line width (corresponding to the predicted line width z) on the front surface Wa of the substrate W (process S26 of FIG. 10).

Thereafter, at least one sensor unit SE provided inside or outside the coating and developing apparatus 2 measures data and transmits the data to the post-data memory unit M12. Thus, the post-data memory unit M12 acquires the post-data (process S27 of FIG. 10). The post-data may be acquired at any time from when the resist pattern is formed on the front surface Wa of the substrate W to when a subsequent processing is performed on the substrate W.

Then, the line width measurement unit U4 measures the line width of the resist pattern formed on the front surface Wa of the substrate W (process S28 of FIG. 10). The line width data of the resist pattern (line width measurement value) measured by the line width measurement unit U4 are stored in the line width measurement value memory unit M14. Also, the process S27 and the process S28 may be performed simultaneously, or the process S28 may be performed before the process S27 is performed.

Thereafter, the update unit M33 updates the partial regression coefficients $\beta_1$ to $\beta_m$ of the line width model stored in the line width model memory unit M16 based on the post-data stored in the post-data memory unit M12, the line width measurement value stored in the line width measurement value memory unit M14, the processing condition calculated by the calculation unit M32 and the film thickness measurement value stored in the film thickness model memory unit M15 (process S29 of FIG. 10). Thus, when a subsequent substrate W is processed, the updated line width model is used. Accordingly, the processing for forming the resist pattern on the single substrate W is ended.

[Operation]

The film thickness of the resist film R formed on the front surface Wa of the substrate W and the line width of the resist pattern correlate with various states of the coating and developing apparatus 2. Therefore, in the above-described example, the film thickness model represented as the function of the predicted film thickness y and the line width model represented as the function of the predicted line width z are prepared and the pre-data indicating the various states of the coating and developing apparatus 2 are applied to these models to predict the film thickness and line width in the substrate W to be processed. For this reason, the future processing quality of the substrate W can be determined based on the predicted film thickness y or the predicted line width z (so-called "feedforward control"). Accordingly, instruction information on the processing of the substrate W is output based on the predicted film thickness y or the predicted line width z and the processing of the substrate W is performed based on the instruction information, and, thus, it is possible to form the structure, such as a film, (resist film R, resist pattern) on the substrate W with higher accuracy without wasting the substrate W.

Here, there is a constant correlation between the predetermined processing condition (rotation number) of the substrate W processed by the coating and developing apparatus 2 and the film thickness of the actually formed resist film R. Therefore, in the above-described exemplary embodiment, the processing condition (rotation number) is calculated using the correlation based on the predicted film thickness y. For this reason, it is possible to automatically set the processing condition of the substrate W to be processed. Likewise, there is a constant correlation between the predetermined processing condition (PEB temperature) of the substrate W processed by the coating and developing apparatus 2 and the line width of the actually formed resist pattern. Therefore, in the above-described exemplary embodiment, the processing condition (PEB temperature) is calculated using the correlation based on the predicted line width z. For this reason, it is possible to automatically set the processing condition of the substrate W to be processed.

According to the above-described exemplary embodiment, the coating and developing apparatus 2 is controlled based on the automatically set processing conditions of the substrate W. For this reason, it is possible to actually process the substrate W based on the automatically set processing conditions.

According to the above-described exemplary embodiment, the instruction information indicating whether or not to continue the processing of the substrate W is output based on the predicted film thickness. If the instruction information indicates the non-continuance, the processing of the substrate W is stopped. Thus, it is possible to further suppress the waste of the substrate W.

According to the above-described exemplary embodiment, the line width model represented as the function of the predicted line width z is prepared and the pre-data indicating the various states of the coating and developing apparatus 2, and then, the film thickness measurement value of the resist film R formed on the front surface Wa of the substrate W are applied to this model to predict the line width of the substrate W to be processed. In this case, the film thickness measurement value is additionally used to calculate the predicted line width z. For this reason, the accuracy of the predicted line width z can be increased.

According to the above-described exemplary embodiment, the film thickness model is updated based on the post-data and the film thickness measurement value. That is, the film thickness model is updated using various parameters for actual processing of the substrate W. For this reason, the accuracy of the film thickness model can be increased. Likewise, according to the above-described exemplary embodiment, the line width model is updated based on the post-data and the line width measurement value. That is, the line width model is updated using various parameters for actual processing of the substrate W. For this reason, the accuracy of the line width model can be increased.

According to the above-described exemplary embodiment, the film thickness model may be updated based on the processing condition (rotation number) of the substrate W processed by the coating and developing apparatus 2, the post-data and the film thickness measurement value. In this case, the number of parameters used for updating the film thickness model increases. Therefore, the accuracy of the film thickness model can be increased. Likewise, according to the above-described exemplary embodiment, the line width model may be updated based on the processing condition (PEB temperature) of the substrate W processed by the coating and developing apparatus 2, the post-data and the line width measurement value. In this case, the number of parameters used for updating the line width model increases. Therefore, the accuracy of the line width model can be increased.

According to the above-described exemplary embodiment, the film thickness model is represented as the multiple regression equation containing the partial regression coefficients and the explanatory variables. In this case, it is possible to relatively simply obtain the film thickness model considering various factors. Likewise, the line width model is represented as the multiple regression equation containing the partial regression coefficients and the explanatory variables. In this case, it is possible to relatively simply obtain the line width model considering various factors.

According to the above-described exemplary embodiment, the sensor unit SE may be placed above the substrate holder 20 within the liquid processing unit U1. In this case, the sensor unit SE is located above the substrate holder 20 by the influence of the descending flow. For this reason, even if various processing liquids supplied onto the substrate W are scattered from the substrate W, the sensor unit SE is hardly influenced by the scattered processing liquids. Therefore, various data can be acquired by the sensor unit SE in the environment near the substrate W. As a result, the accuracy of the model (film thickness model or line width model) and the predicted value (predicted film thickness or predicted line width) can be further increased.

Modification Examples

The exemplary embodiments disclosed herein are illustrative and do not limit the present disclosure. The above-described exemplary embodiments may be omitted, substituted, or changed in various forms without departing from the scope and spirit of the appended claims.

Figure 11:
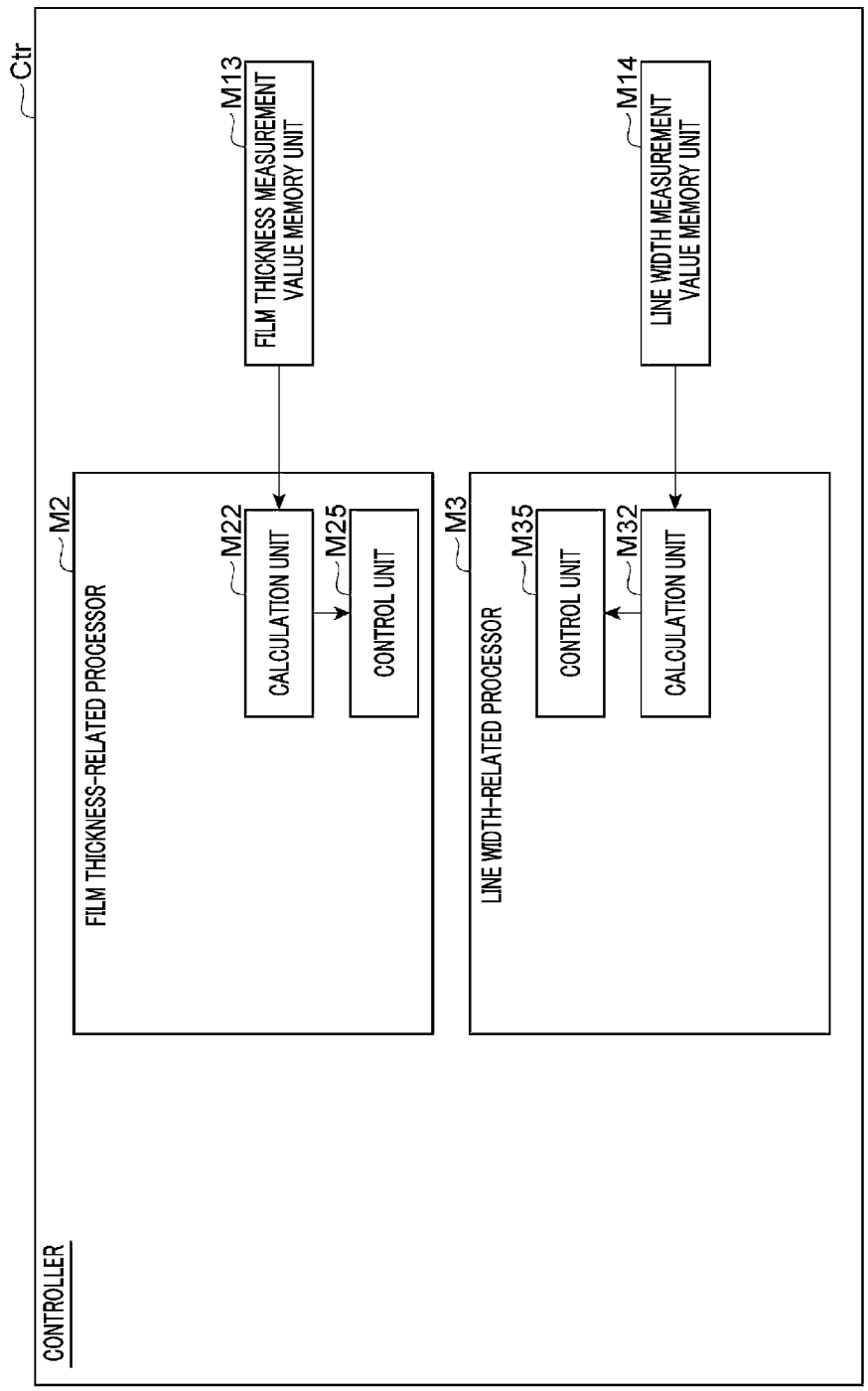
FIG. 11 is a block diagram illustrating another example of the controller.

(1) As shown in FIG. 11, the calculation unit M22 may be configured to calculate the processing condition of the substrate W based on the film thickness measurement value of the substrate W that has been processed earlier than the substrate W to be processed this time as the film thickness measurement value stored in the film thickness measurement value memory unit M13 (so-called "feedback control"). Likewise, the calculation unit M32 may be configured to calculate the processing condition of the substrate W based on the line width measurement value of the substrate W that has been processed earlier than the substrate W to be processed this time as the line width measurement value stored in the line width measurement value memory unit M14.

Figure 12:
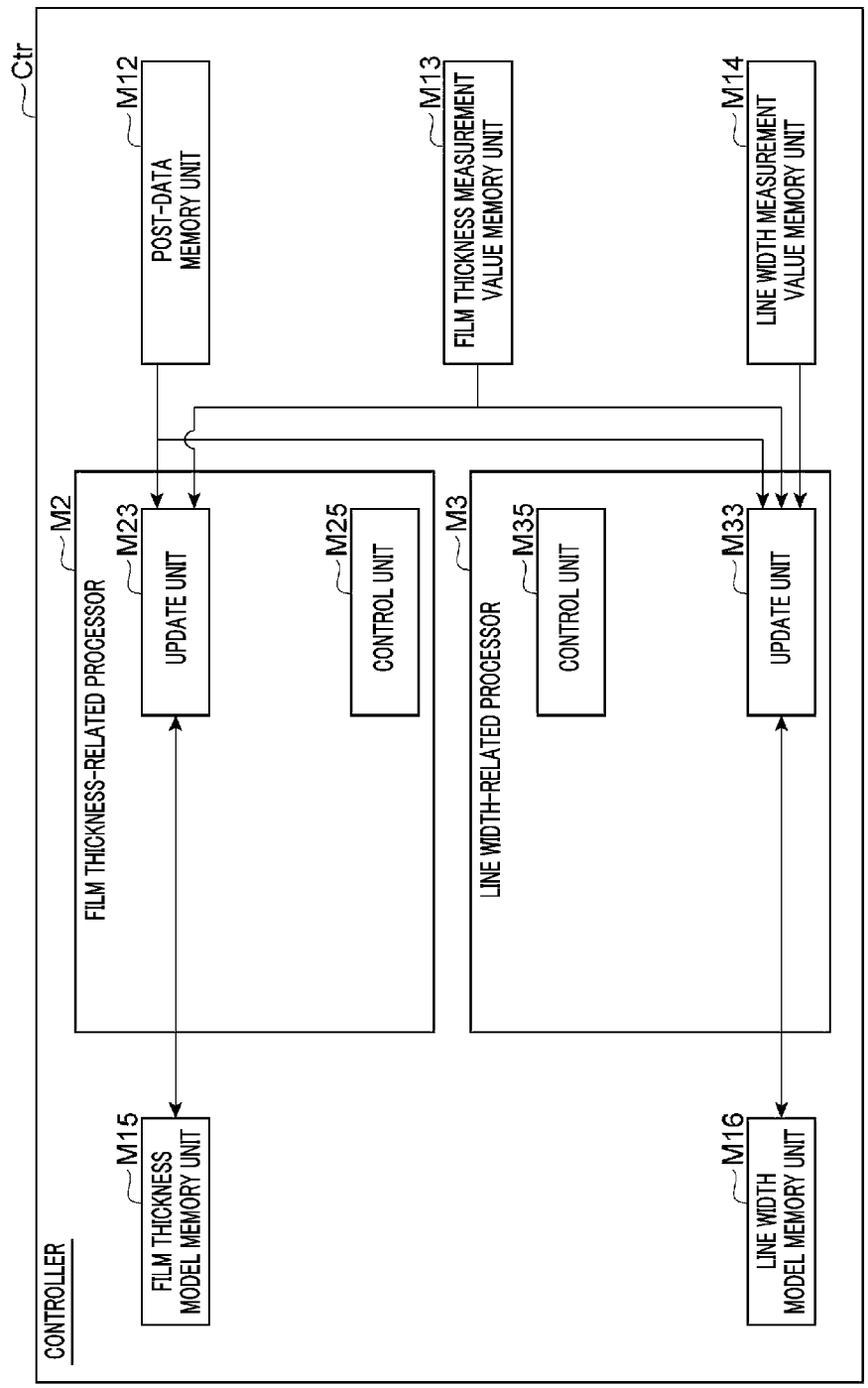
FIG. 12 is a block diagram illustrating yet another example of the controller.

(2) To empirically obtain the film thickness model, the controller Ctr shown in FIG. 12 may be used. In this case, the control unit M25 may process the substrate W based on predetermined different processing conditions (recipes) to form the resist film R on the front surface Wa of the substrate W. Then, at least one sensor unit SE provided inside or outside the coating and developing apparatus 2 measures data and transmits the data to the post-data memory unit M12. Thereafter, the film thickness measurement unit U3 measures the film thickness of the resist film R formed on the front surface Wa of the substrate W. The acquisition of the post-data and the measurement of the film thickness of the resist film R may be performed simultaneously, or one of these processings may be performed earlier than the other. Then, the update unit M23 calculates the partial regression coefficients $\alpha_1$ to $\alpha_k$ based on the post-data stored in the post-data memory unit M12 and the film thickness measurement value stored in the film thickness measurement value memory unit M13. Accordingly, the film thickness model to be used for calculating the predicted film thickness y is prepared.

Likewise, to empirically obtain the line width model, the controller Ctr shown in FIG. 12 may be used. In this case, the control unit M35 may process the substrate W based on predetermined different processing conditions (recipes) to form the resist pattern on the front surface Wa of the substrate W. Then, at least one sensor unit SE provided inside or outside the coating and developing apparatus 2 measures data and transmits the data to the post-data memory unit M12. Thereafter, the line width measurement unit U4 measures the line width of the resist pattern formed on the front surface Wa of the substrate W. The acquisition of the post-data and the measurement of the line width of the resist pattern may be performed simultaneously, or one of these processings may be performed earlier than the other. Then, the update unit M33 calculates the partial regression coefficients $\beta_1$ to $\beta_m$ based on the post-data stored in the post-data memory unit M12 and the line width measurement value stored in the line width measurement value memory unit M14. Accordingly, the line width model to be used for calculating the predicted line width z is prepared. The update unit M33 may calculate the partial regression coefficients $\beta_1$ to $\beta_m$ using the film thickness measurement value stored in the film thickness model memory unit M15.

Figure 13:
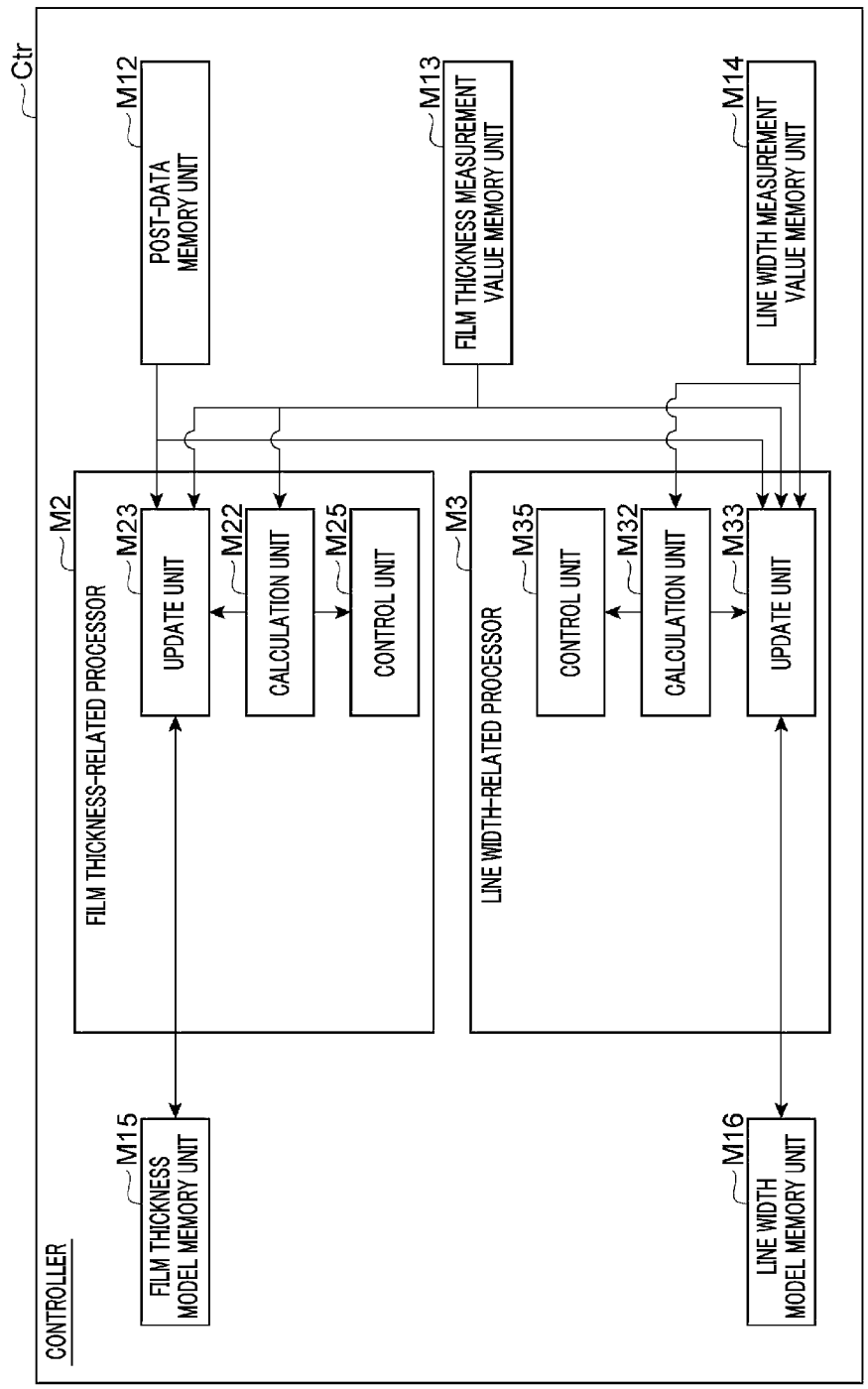
FIG. 13 is a block diagram illustrating still yet another example of the controller.

(3) To empirically obtain the film thickness model, the controller Ctr shown in FIG. 13 may be used. In this case, unlike the example shown in FIG. 12, the calculation unit M22 calculates the processing condition of the substrate W based on the film thickness measurement value of the substrate W that has been processed earlier than the substrate W to be processed this time (feedback control). Then, the controller Ctr processes a subsequent substrate W based on the calculated processing condition to form the resist film R on the front surface Wa of the substrate W. Thereafter, at least one sensor unit SE provided inside or outside the coating and developing apparatus 2 measures data and transmits the data to the post-data memory unit M12. Thereafter, the film thickness measurement unit U3 measures the film thickness of the resist film R formed on the front surface Wa of the substrate W. The acquisition of the post-data and the measurement of the film thickness of the resist film R may be performed simultaneously, or one of these processings may be performed earlier than the other. Then, the update unit M23 calculates the partial regression coefficients $\alpha_1$ to $\alpha_k$ based on the post-data stored in the post-data memory unit M12, the film thickness measurement value stored in the film thickness measurement value memory unit M13 and the processing condition calculated by the calculation unit M22. Accordingly, the film thickness model to be used for calculating the predicted film thickness y is prepared.

Likewise, to empirically obtain the line width model, the controller Ctr shown in FIG. 13 may be used. In this case, unlike the example shown in FIG. 12, the calculation unit M32 calculates the processing condition of the substrate W based on the line width measurement value of the substrate W that has been processed earlier than the substrate W to be processed this time (feedback control). Then, the controller Ctr processes the subsequent substrate W based on the calculated processing condition to form the resist pattern on the front surface Wa of the substrate W. Thereafter, at least one sensor unit SE provided inside or outside the coating and developing apparatus 2 measures data and transmits the data to the post-data memory unit M12. Thereafter, the line width measurement unit U4 measures the line width of the resist pattern formed on the front surface Wa of the substrate W. The acquisition of the post-data and the measurement of the line width of the resist pattern may be performed simultaneously, or one of these processings may be performed earlier than the other. Then, the update unit M33 calculates the partial regression coefficients $\beta_1$ to $\beta_m$ based on the post-data stored in the post-data memory unit M12, the line width measurement value stored in the line width measurement value memory unit M14 and the processing condition calculated by the calculation unit M32. Accordingly, the line width model to be used for calculating the predicted line width z is prepared.

Figure 14:
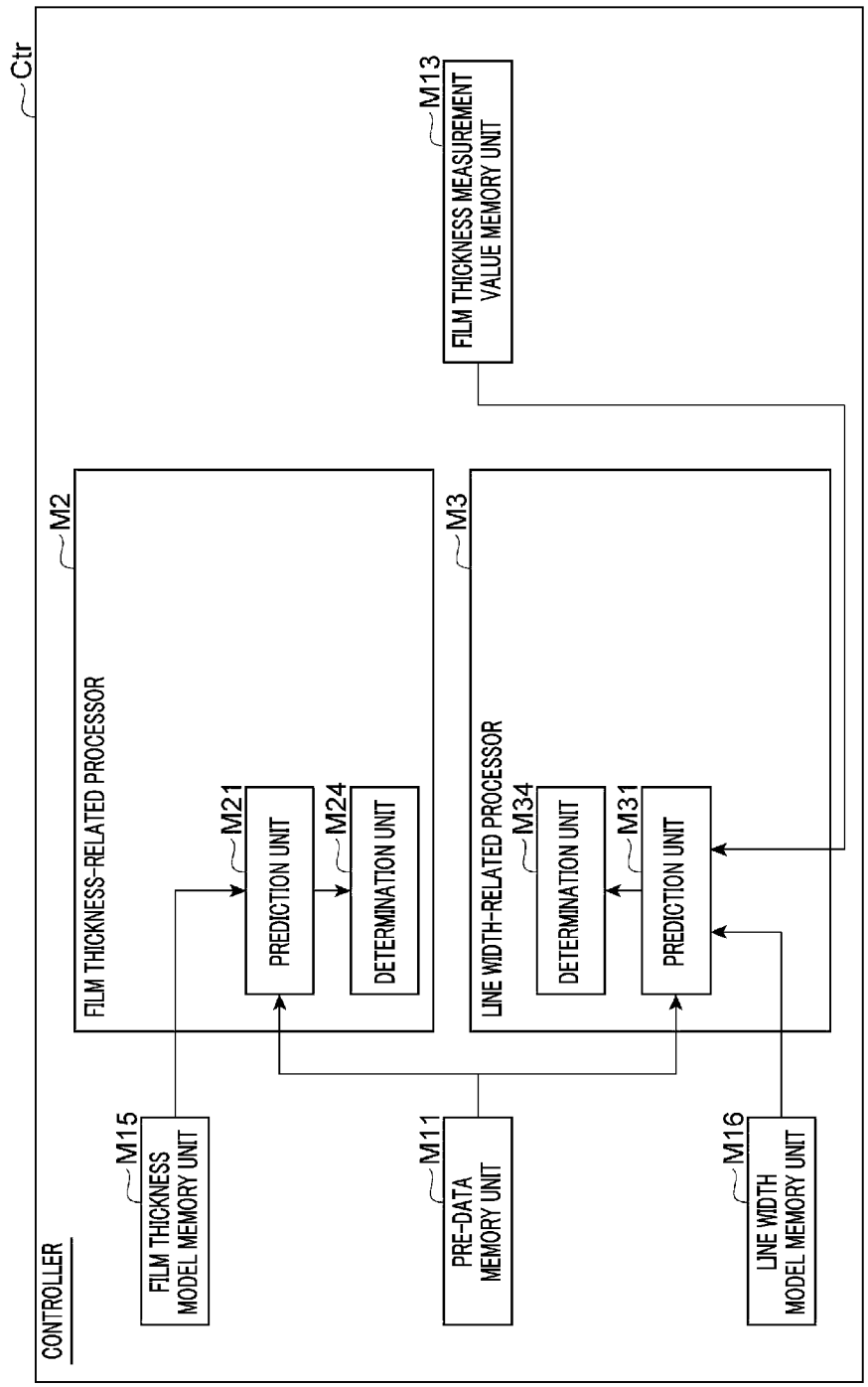
FIG. 14 is a block diagram illustrating still yet another example of the controller.

(4) As shown in FIG. 14, the determination unit M24 may determine whether or not there is an error in the pre-data used as the basis for calculating the predicted film thickness y based on the predicted film thickness y calculated by the prediction unit M21. The determination unit M24 may be configured to specify a place near the sensor unit SE, which has measured the pre-data, based on the error in the pre-data. Likewise, as shown in FIG. 14, the determination unit M34 may determine whether or not there is an error in the pre-data used as the basis for calculating the predicted line width z based on the predicted line width z calculated by the prediction unit M31. The determination unit M34 may be configured to specify a place near the sensor unit SE, which has measured the pre-data, based on the error in the pre-data. The error in the pre-data may be determined by, for example, the principal component analysis, the MT-method (Mahalanobis-Taguchi System) or the T-method.

Figure 15:
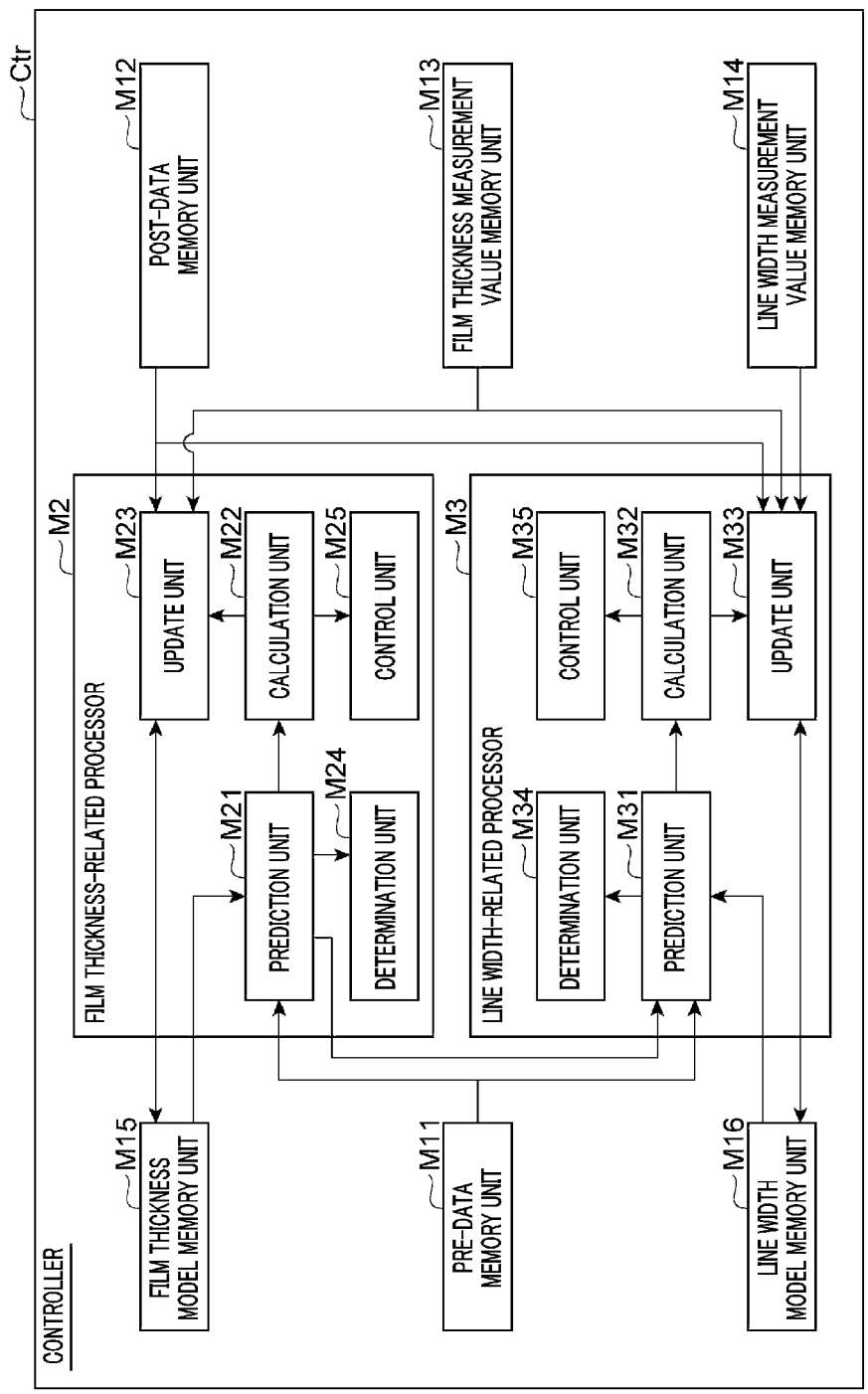
FIG. 15 is a block diagram illustrating still yet another example of the controller.

(5) As shown in FIG. 15, the prediction unit M31 may further use the predicted film thickness y calculated by the prediction unit M21 to calculate the predicted line width z. In this case, the predicted film thickness y is additionally used to calculate the predicted line width z. For this reason, the accuracy of the predicted line width z can be increased.

(6) The processing condition calculated by the calculation unit M22 may be a temperature or a time for thermal processing (PAB) in the thermal processing unit U2 of the processing module PM3 as well as the rotation number of the substrate W in the liquid processing unit U1 of the processing module PM3. The control unit M25 may control the thermal processing unit U2 based on the calculated processing condition (temperature or time for PAB).

(7) The processing condition calculated by the calculation unit M32 may be the time for thermal processing (PEB) in the thermal processing unit U2 of the processing module PM4 as well as the temperature for thermal processing (PEB) in the thermal processing unit U2 of the processing module PM4. Otherwise, the processing condition calculated by the calculation unit M32 may be the development time of the resist film R and the temperature of the developer in the liquid processing unit U1 of the coating and developing apparatus 2.

(8) The film thickness of the resist film R may be measured by the film thickness measurement unit U3 placed inside the coating and developing apparatus 2 or may be measured by an external measurement device placed outside the coating and developing apparatus 2. Likewise, the line width of the resist pattern may be measured by the line width measurement unit U4 placed inside the coating and developing apparatus 2 or may be measured by an external measurement device placed outside the coating and developing apparatus 2.

(9) The feedforward control or the feedback control may be performed for the single substrate W or may be performed for the substrates W (for each lot).

(10) The state of the coating and developing apparatus 2 may be estimated using a Kalman filter.

(11) When the film thickness model or the line width model is prepared, the explanatory variables may be selected by, for example, forward selection, backward elimination, bidirectional elimination, an artificial intelligence-based method (genetic algorithm, etc.) or a combination thereof.

Another Examples

Example 1. An information processing apparatus includes a prediction unit configured to calculate, based on a film thickness model representing a relationship between a state of a substrate processing apparatus and a film thickness of a coating film formed on a front surface of a substrate by the substrate processing apparatus and pre-data representing the state of the substrate processing apparatus before the substrate is processed by the substrate processing apparatus, a predicted film thickness when the substrate is processed by the substrate processing apparatus; and an output unit configured to output, based on the predicted film thickness, instruction information on a processing of the substrate before the substrate is processed by the substrate processing apparatus. In this case, various states of the substrate processing apparatus correlate with the film thickness of the coating film formed on the front surface of the substrate, and, thus, by inputting the pre-data into the film thickness model, the film thickness of the film to be formed on the substrate can be predicted. For this reason, the future processing quality of the substrate can be determined based on the predicted film thickness (so-called "feedforward control"). Accordingly, the instruction information on the processing of the substrate is output based on the predicted film thickness or the predicted line width and a processing of the substrate is performed based on the instruction information, and, thus, it is possible to form the structure, such as the film, on the substrate with higher accuracy without wasting the substrate.

Example 2. The output unit in Example 1 may include a calculation unit configured to calculate, based on the predicted film thickness, a processing condition. There is a constant correlation between the processing condition of the substrate and the film thickness. Therefore, it is possible to automatically set the processing condition of the substrate to be processed by using the predicted film thickness.

Example 3. The information processing apparatus in Example 2 may further include a control unit configured to control, based on the processing condition, the substrate processing apparatus. In this case, it is possible to actually process the substrate based on the automatically set processing condition.

Example 4. The output unit in any one of Examples 1 to 3 may include a determination unit configured to output instruction information indicating whether or not to continue the processing of the substrate. If the instruction information indicates the non-continuance, the processing of the substrate W is stopped. Thus, it is possible to further suppress waste of the substrate W.

Example 5. The information processing apparatus in any one of Examples 1 to 4 may further include an update unit configured to update the film thickness model based on post-data representing the state of the substrate processing apparatus when the substrate is processed and a film thickness measurement value of the coating film formed on the front surface of the substrate when the substrate is processed by the substrate processing apparatus. In this case, the film thickness model is updated using various parameters for actual processing of the substrate. For this reason, the accuracy of the film thickness model can be increased.

Example 6. In the information processing apparatus in Example 2, the update unit may be configured to update the film thickness model based on a processing condition of the substrate processed by the substrate processing apparatus, the post-data and the film thickness measurement value. In this case, the film thickness model is updated using various parameters for actual processing of the substrate. For this reason, the accuracy of the film thickness model can be further increased.

Example 7. In the information processing apparatus in any one of Examples 1 to 6, the film thickness model may be a multiple regression equation containing multiple partial regression coefficients and multiple explanatory variables. In this case, it is possible to relatively simply obtain the film thickness model considering various factors.

Example 8. An information processing apparatus includes a prediction unit configured to calculate, based on a line width model representing a relationship between a state of a substrate processing apparatus and a line width of a pattern formed on a front surface of a substrate by the substrate processing apparatus and pre-data representing the state of the substrate processing apparatus before the substrate is processed by the substrate processing apparatus, a predicted line width when the substrate is processed by the substrate processing apparatus; and an output unit configured to output, based on the predicted line width, instruction information on a processing of the substrate before the substrate is processed by the substrate processing apparatus. In this case, the same operational effect as in the apparatus of the first example can be obtained.

Example 9. The output unit in Example 8 may include a calculation unit configured to calculate, based on the predicted line width, a processing condition. In this case, the same operational effect as in the information processing apparatus of the second example can be obtained.

Example 10. The information processing apparatus in Example 8 may further include a control unit configured to control, based on the processing condition, the substrate processing apparatus. In this case, the same operational effect as in the information processing apparatus of the third example can be obtained.

Example 11. The output unit in any one of Examples 8 to 10 may include a determination unit configured to output instruction information indicating whether or not to continue the processing of the substrate. In this case, the same operational effect as in the information processing apparatus of the fourth example can be obtained.

Example 12. The information processing apparatus in any one of Examples 8 to 11 may further include an update unit configured to update the line width model based on post-data representing the state of the substrate processing apparatus when the substrate is processed and a line width measurement value of the pattern formed on the front surface of the substrate when the substrate is processed by the substrate processing apparatus. In this case, the same operational effect as in the information processing apparatus of the second example can be obtained.

Example 13. In the information processing apparatus in Example 12, the update unit may be configured to update the line width model based on a processing condition of the substrate processed by the substrate processing apparatus, the post-data and the line width measurement value. In this case, the same operational effect as in the information processing apparatus of the third example can be obtained.

Example 14. In the information processing apparatus in in any one of Examples 8 to 13, the prediction unit may be configured to calculate the predicted line width based on the line width model, the pre-data and a film thickness measurement value of a coating film formed on the front surface of the substrate when the substrate is processed by the substrate processing apparatus. In this case, the film thickness measurement value is additionally used to calculate the predicted line width. For this reason, the accuracy of the predicted line width can be increased.

Example 15. In the information processing apparatus in any one of Examples 8 to 13, the prediction unit may be configured to calculate the predicted line width based on the line width model, the pre-data and a film thickness model representing a relationship between the state of the substrate processing apparatus and a film thickness of a coating film formed on the front surface of the substrate by the substrate processing apparatus. In this case, the predicted film thickness is additionally used to calculate the predicted line width. For this reason, the accuracy of the predicted line width can be increased.

Example 16. In the information processing apparatus in any one of Examples 8 to 15, the line width model may be a multiple regression equation containing multiple partial regression coefficients and multiple explanatory variables. In this case, the same operational effect as in the information processing apparatus of the sixth example can be obtained.

Example 17. In the information processing apparatus in Example 7 or 16, the multiple partial regression coefficients may include at least one value selected from a group consisting of a value depending on a viscosity of a coating liquid applied onto the substrate, a value depending on a temperature of an inside of the substrate processing apparatus, a value depending on a relative humidity of the inside the substrate processing apparatus, a value depending on a pressure difference between the inside and an outside of the substrate processing apparatus, a value depending on a wind speed of the inside of the substrate processing apparatus, a value depending on a structure of the substrate processing apparatus and a value depending on a kind of an organic solvent used in the processing of the substrate.

Example 18. In the information processing apparatus in any one of Examples 1 to 17, the pre-data may include a value obtained by at least one sensor selected from a group consisting of a viscosity sensor configured to measure a viscosity of a coating liquid applied onto the substrate, a temperature sensor configured to measure a temperature of an inside of the substrate processing apparatus, a humidity sensor configured to measure a relative humidity of the inside of the substrate processing apparatus, a differential pressure sensor configured to measure a pressure difference between the inside and an outside of the substrate processing apparatus and a wind speed sensor configured to measure a wind speed of the inside of the substrate processing apparatus.

Example 19. In the information processing apparatus in Example 18, the at least one sensor may be placed inside or outside a processing chamber of the substrate processing apparatus.

Example 20. In the information processing apparatus in Example 19, the at least one sensor may be placed outside the processing chamber of the substrate processing apparatus, and placed in a transfer path of the substrate or a container of the substrate.

Example 21. In the information processing apparatus in Example 19 or 20, the at least one sensor may be placed inside the processing chamber of the substrate processing apparatus, and placed above a substrate holder provided in the processing chamber. In general, the descending flow (down flow) flows downwards to the substrate within the processing chamber. For this reason, on the downstream side of the substrate, various processing liquids for processing the substrate can be easily scattered. According to the nineteenth example, the sensor can acquire various data from the environment near the substrate without being influenced by the various processing liquids. For this reason, the accuracy of the model (film thickness model or line width model) and the predicted value (predicted film thickness or predicted line width) can be further increased.

Example 22. An information processing method includes calculating, based on a line width model representing a relationship between a state of a substrate processing apparatus and a line width of a pattern formed on a front surface of a substrate by the substrate processing apparatus and pre-data representing the state of the substrate processing apparatus before the substrate is processed by the substrate processing apparatus, a predicted line width when the substrate is processed by the substrate processing apparatus; and outputting, based on the predicted film thickness, instruction information on a processing of the substrate before the substrate is processed by the substrate processing apparatus.

Example 23. An information processing method includes calculating, based on a line width model representing a relationship between a state of a substrate processing apparatus and a line width of a pattern formed on a front surface of a substrate by the substrate processing apparatus and pre-data representing the state of the substrate processing apparatus before the substrate is processed by the substrate processing apparatus, a predicted line width when the substrate is processed by the substrate processing apparatus; and outputting, based on the predicted line width, instruction information on a processing of the substrate before the substrate is processed by the substrate processing apparatus. In this case, the same operational effect as in the information processing apparatus of the first example can be obtained.

Example 24. A computer-readable recording medium has stored thereon computer-executable instructions that, in response to execution, cause an information processing apparatus to perform the information processing method of Example 22 or 23. In this case, the same operational effect as in the information processing apparatus of the first example can be obtained. In this specification, the computer-readable recording medium may include a non-transitory tangible medium (non-transitory computer recording medium) (e.g., main memory or sub memory), or a transmission signal (transitory computer recording medium) (e.g., data signal that can be provided through a network).

According to the information processing apparatus, the information processing method and the computer-readable recording medium disclosed herein, it is possible to form the structure, such as the film, on the substrate with high accuracy.

From the foregoing, it will be appreciated that various exemplary embodiments of the present disclosure have been described herein for purposes of illustration and various changes can be made without departing from the scope and spirit of the present disclosure. Accordingly, various exemplary embodiments described herein are not intended to be limiting, and the true scope and spirit are indicated by the following claims.

We claim:

1. An information processing apparatus, comprising:
at least one processor;
at least one memory storing program; and
a wind speed sensor configured to measure a wind speed of an inside of a substrate processing apparatus,
where the at least one memory and the program are configured, with the at least one processor, to cause the apparatus to:
calculate, based on a film thickness model representing a relationship between a state of the substrate processing apparatus and a film thickness of a coating film formed on a front surface of a substrate by the substrate processing apparatus and pre-data representing the state of the substrate processing apparatus before the substrate is processed by the substrate processing apparatus, a predicted film thickness when the substrate is processed by the substrate processing apparatus,
output, based on the predicted film thickness, instruction information indicating whether or not to continue the processing of the substrate,
calculate, based on the predicted film thickness, a processing condition of the substrate processed by the substrate processing apparatus,
output instruction information on a processing of the substrate including the processing condition calculated based on the predicted film thickness before the substrate is processed by the substrate processing apparatus, and
control, based on the processing condition of the substrate, the substrate processing apparatus,
wherein the pre-data includes the wind speed measured by the wind speed sensor,
wherein the film thickness model is represented as a multiple regression equation containing multiple partial regression coefficients and multiple explanatory variables, and
wherein the multiple partial regression coefficients include a value that varies depending on the wind speed of the inside of the substrate processing apparatus.

2. The information processing apparatus of claim 1,
wherein the at least one memory and the program are further configured, with the at least one processor, to cause the apparatus to:
update the film thickness model based on post-data representing the state of the substrate processing apparatus when the substrate is processed and a film thickness measurement value of the coating film formed on the front surface of the substrate when the substrate is processed by the substrate processing apparatus.

3. The information processing apparatus of claim 2,
wherein the at least one memory and the program are further configured, with the at least one processor, to cause the apparatus to:
update the film thickness model based on a processing condition of the substrate processed by the substrate processing apparatus, the post-data and the film thickness measurement value.

4. An information processing apparatus, comprising:
at least one processor;
at least one memory storing program; and
a wind speed sensor configured to measure a wind speed of an inside of a substrate processing apparatus,
where the at least one memory and the program are configured, with the at least one processor, to cause the apparatus to:
calculate, based on a line width model representing a relationship between a state of the substrate processing apparatus and a line width of a pattern formed on a front surface of a substrate by the substrate processing apparatus and pre-data representing the state of the substrate processing apparatus before the substrate is processed by the substrate processing apparatus, a predicted line width when the substrate is processed by the substrate processing apparatus, output, based on the predicted line width, instruction information indicating whether or not to continue the processing of the substrate, calculate, based on the predicted line width, a processing condition of the substrate processed by the substrate processing apparatus, output instruction information on a processing of the substrate including the processing condition calculated based on the predicted line width before the substrate is processed by the substrate processing apparatus, and control, based on the processing condition of the substrate, the substrate processing apparatus, wherein the pre-data includes the wind speed measured by the wind speed sensor, wherein the line width model is represented as a multiple regression equation containing multiple partial regression coefficients and multiple explanatory variables, and wherein the multiple partial regression coefficients include a value that varies depending on the wind speed of the inside of the substrate processing apparatus.

5. The information processing apparatus of claim 4, wherein the at least one memory and the program are further configured, with the at least one processor, to cause the apparatus to:

update the line width model based on post-data representing the state of the substrate processing apparatus when the substrate is processed and a line width measurement value of the pattern formed on the front surface of the substrate when the substrate is processed by the substrate processing apparatus.

6. The information processing apparatus of claim 5, wherein the at least one memory and the program are further configured, with the at least one processor, to cause the apparatus to:

update the line width model based on a processing condition of the substrate processed by the substrate processing apparatus, the post-data and the line width measurement value.

7. The information processing apparatus of claim 4, wherein the at least one memory and the program are further configured, with the at least one processor, to cause the apparatus to:

calculate the predicted line width based on the line width model, the pre-data and a film thickness measurement value of a coating film formed on the front surface of the substrate when the substrate is processed by the substrate processing apparatus.

8. The information processing apparatus of claim 4, wherein the at least one memory and the program are further configured, with the at least one processor, to cause the apparatus to:

calculate the predicted line width based on the line width model, the pre-data and a film thickness model representing a relationship between the state of the substrate processing apparatus and a film thickness of a coating film formed on the front surface of the substrate by the substrate processing apparatus.

9. The information processing apparatus of claim 1, wherein the multiple partial regression coefficients include at least one value selected from a group consisting of a value depending on a viscosity of a coating liquid applied onto the substrate, a value depending on a temperature of an inside of the substrate processing apparatus, a value depending on a relative humidity of the inside of the substrate processing apparatus, a value depending on a pressure difference between the inside and an outside of the substrate processing apparatus, a value depending on a structure of the substrate processing apparatus and a value depending on a kind of an organic solvent used in the processing of the substrate.

10. The information processing apparatus of claim 1, wherein the pre-data includes a value obtained by at least one sensor selected from a group consisting of a viscosity sensor configured to measure a viscosity of a coating liquid applied onto the substrate, a temperature sensor configured to measure a temperature of an inside of the substrate processing apparatus, a humidity sensor configured to measure a relative humidity of the inside of the substrate processing apparatus and a differential pressure sensor configured to measure a pressure difference between the inside and an outside of the substrate processing apparatus.

11. The information processing apparatus of claim 10, wherein the at least one sensor is placed inside or outside a processing chamber of the substrate processing apparatus.

12. The information processing apparatus of claim 11, wherein the at least one sensor is placed outside the processing chamber of the substrate processing apparatus, and placed in a transfer path of the substrate or a container of the substrate.

13. The information processing apparatus of claim 11, wherein the at least one sensor is placed inside the processing chamber of the substrate processing apparatus, and placed above a substrate holder provided in the processing chamber.

14. An information processing method, comprising:

calculating, by a processor, based on a film thickness model representing a relationship between a state of a substrate processing apparatus and a film thickness of a coating film formed on a front surface of a substrate by the substrate processing apparatus and pre-data representing the state of the substrate processing apparatus before the substrate is processed by the substrate processing apparatus, a predicted film thickness when the substrate is processed by the substrate processing apparatus;

outputting, based on the predicted film thickness, instruction information indicating whether or not to continue the processing of the substrate;

calculating, by the processor, based on the predicted film thickness, a processing condition of the substrate processed by the substrate processing apparatus;

outputting, by the processor, instruction information on a processing of the substrate including the processing condition calculated based on the predicted film thickness before the substrate is processed by the substrate processing apparatus; and controlling, by the processor, based on the processing condition of the substrate, the substrate processing apparatus, wherein the pre-data includes a wind speed of the inside of the substrate processing apparatus measured by a wind speed sensor, wherein the film thickness model is represented as a multiple regression equation containing multiple partial regression coefficients and multiple explanatory variables, and wherein the multiple partial regression coefficients include a value that varies depending on the wind speed of the inside of the substrate processing apparatus.

15. An information processing method, comprising:

calculating, by a processor, based on a line width model representing a relationship between a state of a substrate processing apparatus and a line width of a pattern formed on a front surface of a substrate by the substrate processing apparatus and pre-data representing the state of the substrate processing apparatus before the substrate is processed by the substrate processing apparatus, a predicted line width when the substrate is processed by the substrate processing apparatus;

outputting, based on the predicted line width, instruction information indicating whether or not to continue the processing of the substrate, calculating, by the processor, based on the predicted line width, a processing condition of the substrate processed by the substrate processing apparatus;

outputting, by the processor, instruction information on a processing of the substrate including the processing condition calculated based on the predicted line width before the substrate is processed by the substrate processing apparatus; and controlling, by the processor, based on the processing condition, the substrate processing apparatus, wherein the pre-data includes a wind speed of the inside of the substrate processing apparatus measured by a wind speed sensor, wherein the line width model is represented as a multiple regression equation containing multiple partial regression coefficients and multiple explanatory variables, and wherein the multiple partial regression coefficients include a value that varies depending on the wind speed of the inside of the substrate processing apparatus.

16. A non-transitory computer-readable recording medium having stored thereon computer-executable instructions that, in response to execution, cause an information processing apparatus to perform the information processing method as claimed in claim 14.

17. A non-transitory computer-readable recording medium having stored thereon computer-executable instructions that, in response to execution, cause an information processing apparatus to perform the information processing method as claimed in claim 15.

* * * * *